(12) United States Patent
Kim et al.

(10) Patent No.: US 12,114,504 B2
(45) Date of Patent: Oct. 8, 2024

(54) INTEGRATED CIRCUIT DEVICE

(71) Applicant: SAMSUNG ELECTRONICS CO., LTD., Suwon-si (KR)

(72) Inventors: Seungyoon Kim, Seoul (KR); Jaeryong Sim, Suwon-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 320 days.

(21) Appl. No.: 17/321,747

(22) Filed: May 17, 2021

(65) Prior Publication Data
US 2022/0052069 A1     Feb. 17, 2022

(30) Foreign Application Priority Data
Aug. 13, 2020 (KR) .................. 10-2020-0102058

(51) Int. Cl.
| | |
|---|---|
| *H10B 43/50* | (2023.01) |
| *H01L 21/768* | (2006.01) |
| *H01L 23/535* | (2006.01) |
| *H10B 41/27* | (2023.01) |
| *H10B 41/41* | (2023.01) |
| *H10B 41/50* | (2023.01) |

(Continued)

(52) U.S. Cl.
CPC ....... *H10B 43/50* (2023.02); *H01L 21/76805* (2013.01); *H01L 21/76895* (2013.01); *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(58) Field of Classification Search
CPC ........ H10B 43/50; H10B 41/27; H10B 41/41; H10B 41/50; H10B 43/27; H10B 43/40; H10B 41/40; H10B 41/35; H10B 43/35; H01L 21/76805; H01L 21/76895; H01L 23/535; H01L 21/76897
See application file for complete search history.

(56) References Cited

U.S. PATENT DOCUMENTS

| | | |
|---|---|---|
| 9,799,672 B2 | 10/2017 | Son et al. |
| 9,960,080 B2 | 5/2018 | Beyne |

(Continued)

FOREIGN PATENT DOCUMENTS

| | | |
|---|---|---|
| KR | 10-2016-0123081 | 10/2016 |
| KR | 10-2019-0052301 | 5/2019 |

*Primary Examiner* — Jay C Chang
*Assistant Examiner* — Mikka Liu
(74) *Attorney, Agent, or Firm* — F. CHAU & ASSOCIATES, LLC

(57) ABSTRACT

An integrated circuit device includes a substrate, a peripheral circuit structure disposed on the substrate, the peripheral circuit structure including a peripheral circuit and a lower wiring connected to the peripheral circuit, a conductive plate covering a portion of the peripheral circuit structure, a cell array structure disposed on the peripheral circuit structure with the conductive plate therebetween, the cell array structure including a memory cell array and an insulation layer surrounding the memory cell array, a through hole via passing through the insulation layer in a direction vertical to a top surface of the substrate to be connected to the lower wiring, and an etch guide member disposed in the insulation layer at the same level as the conductive plate to contact a portion of the through hole via.

18 Claims, 20 Drawing Sheets

(51) Int. Cl.
*H10B 43/27* (2023.01)
*H10B 43/40* (2023.01)

(56) References Cited

U.S. PATENT DOCUMENTS

| | | | |
|---|---|---|---|
| 10,103,058 | B2 | 10/2018 | Chandrashekar et al. |
| 10,381,371 | B2 | 8/2019 | Ogawa et al. |
| 10,446,570 | B2 | 10/2019 | Lee et al. |
| 10,629,675 | B1 * | 4/2020 | Nishikawa ............. H10B 43/30 |
| 2007/0082446 | A1 * | 4/2007 | Olligs .................... H10B 43/30 |
| | | | 257/E21.507 |
| 2008/0160737 | A1 * | 7/2008 | Oh ..................... H01L 29/66621 |
| | | | 257/E21.294 |
| 2013/0264688 | A1 | 10/2013 | Qian et al. |
| 2014/0264862 | A1 | 9/2014 | Tsai et al. |
| 2015/0348874 | A1 | 12/2015 | Tsai et al. |
| 2020/0006270 | A1 * | 1/2020 | Lee ........................ H10B 41/27 |
| 2020/0075623 | A1 * | 3/2020 | Ito .......................... H10B 43/50 |
| 2020/0091170 | A1 | 3/2020 | Baek |
| 2021/0036006 | A1 * | 2/2021 | Chen ....................... H01L 24/32 |

* cited by examiner

INTEGRATED CIRCUIT DEVICE

CROSS-REFERENCE TO RELATED APPLICATION

This application claims priority under 35 U.S.C. § 119 to Korean Patent Application No. 10-2020-0102058, filed on Aug. 13, 2020, in the Korean Intellectual Property Office, the disclosure of which is incorporated by reference herein in its entirety.

TECHNICAL FIELD

The inventive concept relates to an integrated circuit device, and more particularly, to an integrated circuit device including a non-volatile memory device having a cell on periphery (COP) structure.

DISCUSSION OF RELATED ART

In the electronics industry, integrated circuit devices including a memory device are increasing in capacity and becoming highly integrated. Also, memory cells are becoming smaller in size, and operation circuits and wiring structures included in memory devices are becoming increasingly complicated. Therefore, integrated circuit devices having memory devices with highly integrated structure and good electrical characteristics are needed. Particularly, integrated circuit devices including non-volatile memory devices having a COP structure need to enhance contact reliability between an upper wiring layer and a lower wiring layer.

SUMMARY

The inventive concept provides an integrated circuit device having a structure, in which contact reliability between an upper wiring layer and a lower wiring layer is enhanced in a highly integrated memory device, thereby providing good electrical characteristics.

The object of the inventive concept is not limited to the aforesaid, but other objects not described herein will be clearly understood by those of ordinary skill in the art from descriptions below.

According to an aspect of the inventive concept, an integrated circuit device includes a substrate, a peripheral circuit structure disposed on the substrate, the peripheral circuit structure including a peripheral circuit and a lower wiring connected to the peripheral circuit, a conductive plate covering a portion of the peripheral circuit structure, a cell array structure disposed on the peripheral circuit structure with the conductive plate therebetween, the cell array structure including a memory cell array and an insulation layer surrounding the memory cell array, a through hole via passing through the insulation layer to be connected to the lower wiring, in a direction vertical to a top surface of the substrate, and an etch guide member disposed in the insulation layer at the same level as the conductive plate to contact a portion of the through hole via.

According to another aspect of the inventive concept, an integrated circuit device includes a substrate, a peripheral circuit structure disposed on the substrate, the peripheral circuit structure including a peripheral circuit and a lower wiring connected to the peripheral circuit, a cell array structure overlapping the peripheral circuit structure in a vertical direction and including a memory stack including a plurality of gate lines stacked in the vertical direction and a channel structure passing through the plurality of gate lines in the vertical direction, a conductive plate disposed between the peripheral circuit structure and the cell array structure, a through hole via passing through the cell array structure and extending to an inner portion of the peripheral circuit structure to be connected to the lower wiring, outside the conductive plate, and an etch guide member disposed at the same level as the conductive plate, having the same thickness as a thickness of the conductive plate, and including the same material as the conductive plate, with the through hole via therebetween, the etch guide member penetrating into the through hole via in a horizontal direction.

According to another aspect of the inventive concept, an integrated circuit device includes a substrate, a peripheral circuit structure disposed on the substrate, the peripheral circuit structure including a peripheral circuit and a plurality of lower wiring layers connected to the peripheral circuit, a cell array structure overlapping the peripheral circuit structure in a vertical direction and including a memory stack including a plurality of gate lines stacked and a channel structure passing through the plurality of gate lines in the vertical direction, an insulation layer surrounding the memory stack, and a plurality of upper wiring layers disposed on the channel structure, a plate common source line disposed between the peripheral circuit structure and the cell array structure, a through hole via passing through the insulation layer and extending to an inner portion of the peripheral circuit structure to be connected up to an uppermost layer of the plurality of lower wiring layers from a lowermost layer of the plurality of upper wiring layers, and an etch guide member disposed outside the plate common source line, disposed at the same level as the plate common source line, having the same thickness as a thickness of the plate common source line, and including the same material as a material of the plate common source line, and contacting a sidewall of the through hole via.

BRIEF DESCRIPTION OF THE DRAWINGS

Embodiments of the inventive concept will be more clearly understood from the following detailed description with reference to the accompanying drawings in which.

DETAILED DESCRIPTION OF THE EMBODIMENTS

Figure 1:
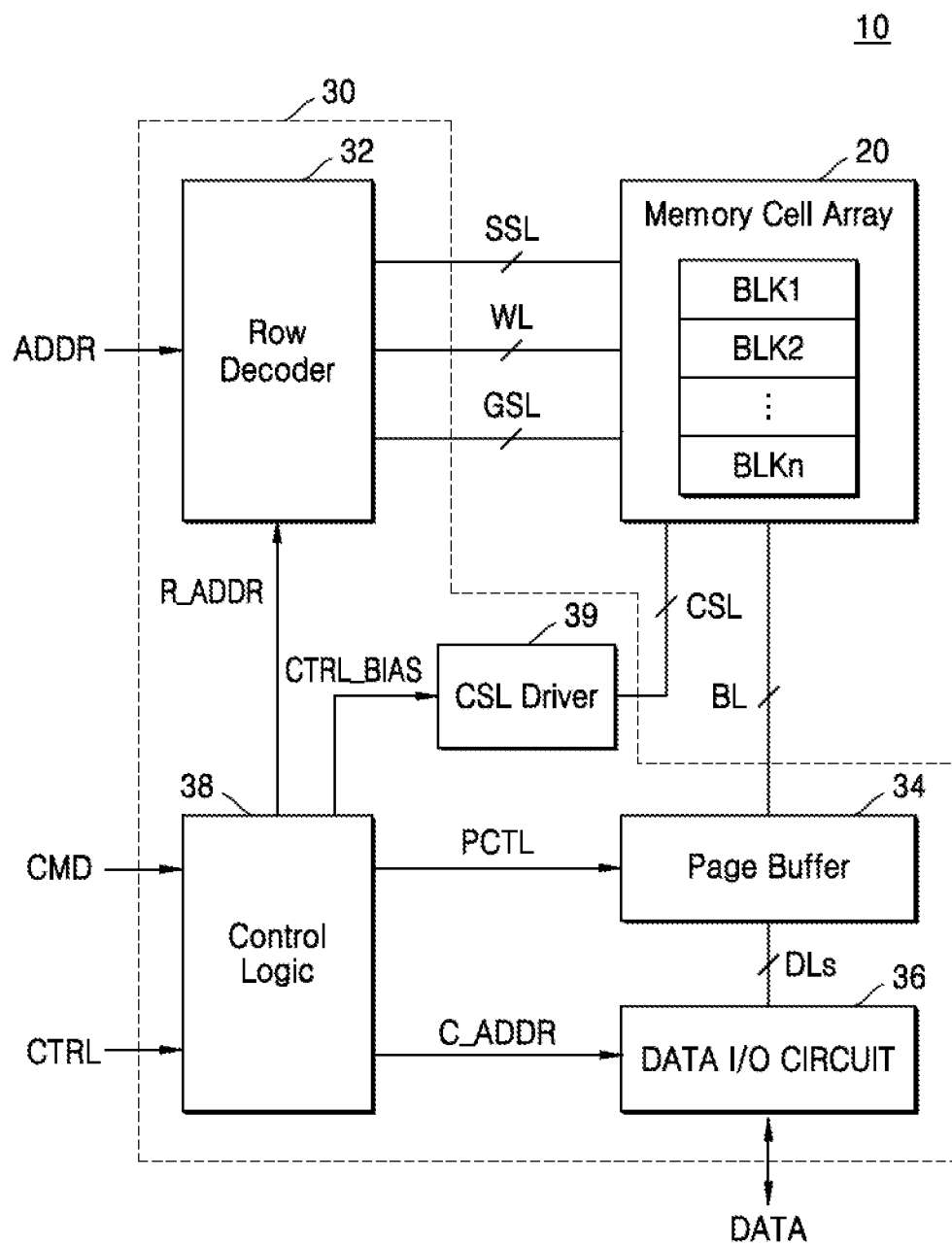
FIG. 1 is a block diagram illustrating an integrated circuit device according to embodiments.

Hereinafter, various example embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification.

FIG. 1 is a block diagram illustrating an integrated circuit device 10 according to embodiments.

Referring to FIG. 1, the integrated circuit device 10 may include a memory cell array 20 and a peripheral circuit 30.

The memory cell array 20 may include a plurality of memory cell blocks BLK1, BLK2, . . . , and BLKn (where n is an integer of 3 or more). The plurality of memory cell blocks BLK1, BLK2, . . . , and BLKn may each include a plurality of memory cells. The plurality of memory cell blocks BLK1, BLK2, . . . , and BLKn may be connected to the peripheral circuit 30 through a bit line BL, a word line WL, a string selection line SSL, and a ground selection line GSL.

The memory cell array 20 may be connected to a page buffer 34 through the bit line BL and may be connected to a row decoder 32 through the word line WL, the string selection line SSL, and the ground selection line GSL. In the memory cell array 20, each of the plurality of memory cells included in the plurality of memory cell blocks BLK1, BLK2, . . . , and BLKn may include a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL, which are vertically stacked.

The peripheral circuit 30 may include the row decoder 32, the page buffer 34, a data input/output (I/O) circuit 36, a control logic 38, and a common source line driver 39. The peripheral circuit 30 may further include various circuits such as a voltage generating circuit for generating various voltages needed for an operation of the integrated circuit device 10, an error correction circuit for correcting an error of data read from the memory cell array 20, and an I/O interface.

The peripheral circuit 30 may receive an address ADDR, a command CMD, and a control signal CTRL from the outside of the integrated circuit device 10 and may transmit and receive data DATA to and from an external device outside the integrated circuit device 10.

A configuration of the peripheral circuit 30 will be described below in detail.

The row decoder 32 may select at least one memory cell block from among the plurality of memory cell blocks BLK1, BLK2, . . . , and BLKn in response to the input address ADDR and may select a word line WL, a string selection line SSL, and a ground selection line GSL of the selected memory cell block. The row decoder 32 may provide the word line WL of the selected memory cell block with a voltage for performing a memory operation.

The page buffer 34 may be connected to the memory cell array 20 through the bit line BL. In a program operation, the page buffer 34 may operate as a write driver to apply a voltage to the bit line BL based on the data DATA which is to be stored in the memory cell array 20, and in a read operation, the page buffer 34 may operate as a sense amplifier to sense the data DATA stored in the memory cell array 20. The page buffer 34 may operate based on the control signal CTRL provided from the control logic 38.

The data I/O circuit 36 may be connected to the page buffer 34 through a plurality of data lines DLs. In a program operation, the data I/O circuit 36 may receive the data DATA from a memory controller, and based on a column address C_ADDR provided from the control logic 38, the data I/O circuit 36 may provide program data DATA to the page buffer 34. In a read operation, the data I/O circuit 36 may provide the memory controller with read data DATA stored in the page buffer 34 on the basis of the column address C_ADDR provided from the control logic 38. The data I/O circuit 36 may transfer an address or a command input thereto to the control logic 38 or the row decoder 32.

The control logic 38 may receive the command CMD and the control signal CTRL from the memory controller. The control logic 38 may provide a row address R_ADDR to the row decoder 32 and may provide the column address C_ADDR to the data I/O circuit 36. The control logic 38 may generate various internal control signals used in the integrated circuit device 10 in response to the control signal CTRL. For example, the control logic 38 may adjust a voltage level provided to the word line WL and the bit line BL in performing a memory operation such as a program operation or an erase operation.

The common source line driver 39 may be connected to the memory cell array 20 through a common source line CSL. The common source line driver 39 may apply a common source voltage (for example, a source voltage) or a ground voltage to the common source line CSL in response to control from the control logic 38. In some embodiments, the common source line driver 39 may be disposed under the memory cell array 20. The common source line driver 39 may be disposed to vertically overlap at least a portion of the memory cell array 20. The common source line driver 39 may output the common source voltage to a conductive plate 110 (see FIG. 6), supporting the memory cell array 20, through a wiring structure disposed under the memory cell array 20.

Figure 2:
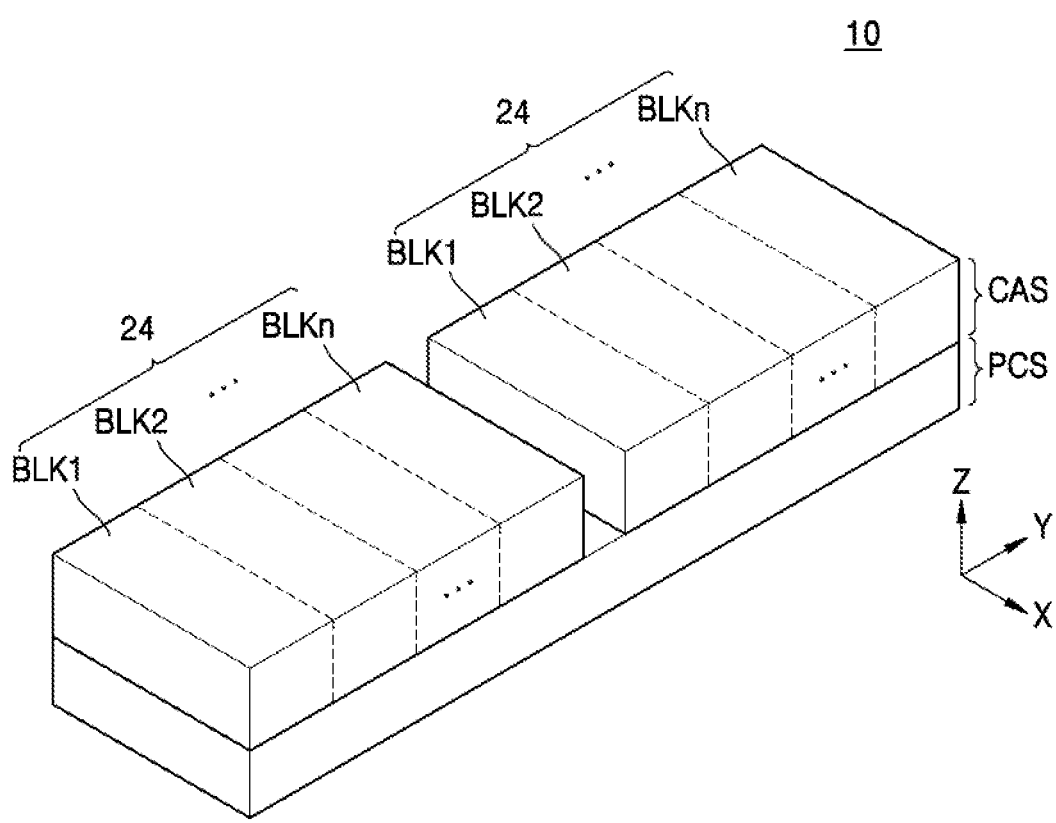
FIG. 2 is a perspective view of an integrated circuit device according to embodiments.

FIG. 2 is a perspective view of an integrated circuit device 10 according to embodiments.

Referring to FIG. 2, the integrated circuit device 10 may include a cell array structure CAS and a peripheral circuit structure PCS, which overlap each other in a vertical direction (a Z direction).

The cell array structure CAS may include a memory cell array 20 (see FIG. 1), and the peripheral circuit structure PCS may include a peripheral circuit 30 (see FIG. 1).

The cell array structure CAS may include a plurality of tiles 24. The plurality of tiles 24 may each include a plurality of memory cell blocks BLK1, BLK2, ..., and BLKn. Each of the plurality of memory cell blocks BLK1, BLK2, ..., and BLKn may include a plurality of memory cells, which may be three-dimensionally arranged.

Figure 3:
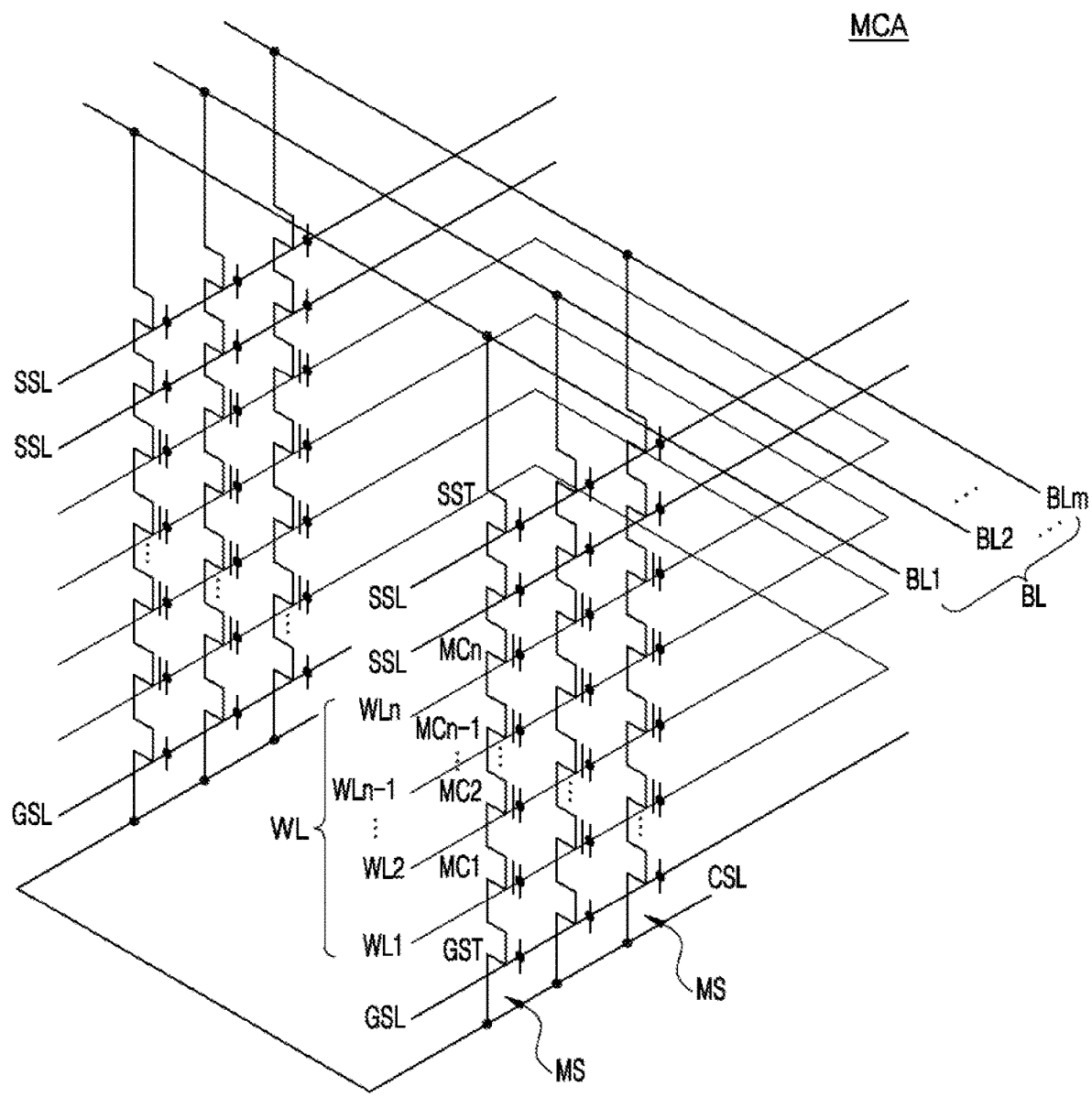
FIG. 3 is an equivalent circuit diagram of a memory cell array of an integrated circuit device according to embodiments.

FIG. 3 is an equivalent circuit diagram of a memory cell array MCA of an integrated circuit device according to embodiments.

Referring to FIG. 3, an equivalent circuit diagram of a vertical NAND flash memory having a vertical channel structure is illustrated.

The memory cell array MCA may include a plurality of memory cell strings MS. The memory cell array MCA may include a plurality of bit lines BL, a plurality of word lines WL, at least one string selection line SSL, at least one ground selection line GSL, and a common source line CSL.

A plurality of memory cell strings MS may be formed between the plurality of bit lines BL and the common source line CSL. In FIG. 3, an example where each of the plurality of memory cell strings MS includes two string selection lines SSL is illustrated, but the inventive concept is not limited thereto. For example, the plurality of memory cell strings MS may each include one string selection line SSL.

The plurality of memory cell strings MS may each include a string selection transistor SST, a ground selection transistor GST, and a plurality of memory cell transistors MC1, MC2, ..., MCn-1, and MCn. A drain region of the string selection transistor SST may be connected to a bit line BL, and a source region of the ground selection transistor GST may be connected to the common source line CSL. The common source line CSL may connect source regions that ground selection transistors from a plurality of ground selection transistors GST have in common.

The string selection transistor SST may be connected to the string selection line SSL, and the ground selection transistor GST may be connected to the ground selection line GSL. The plurality of memory cell transistors MC1, MC2, ..., MCn-1, and MCn may be respectively connected to a plurality of word lines WL.

Figure 4:
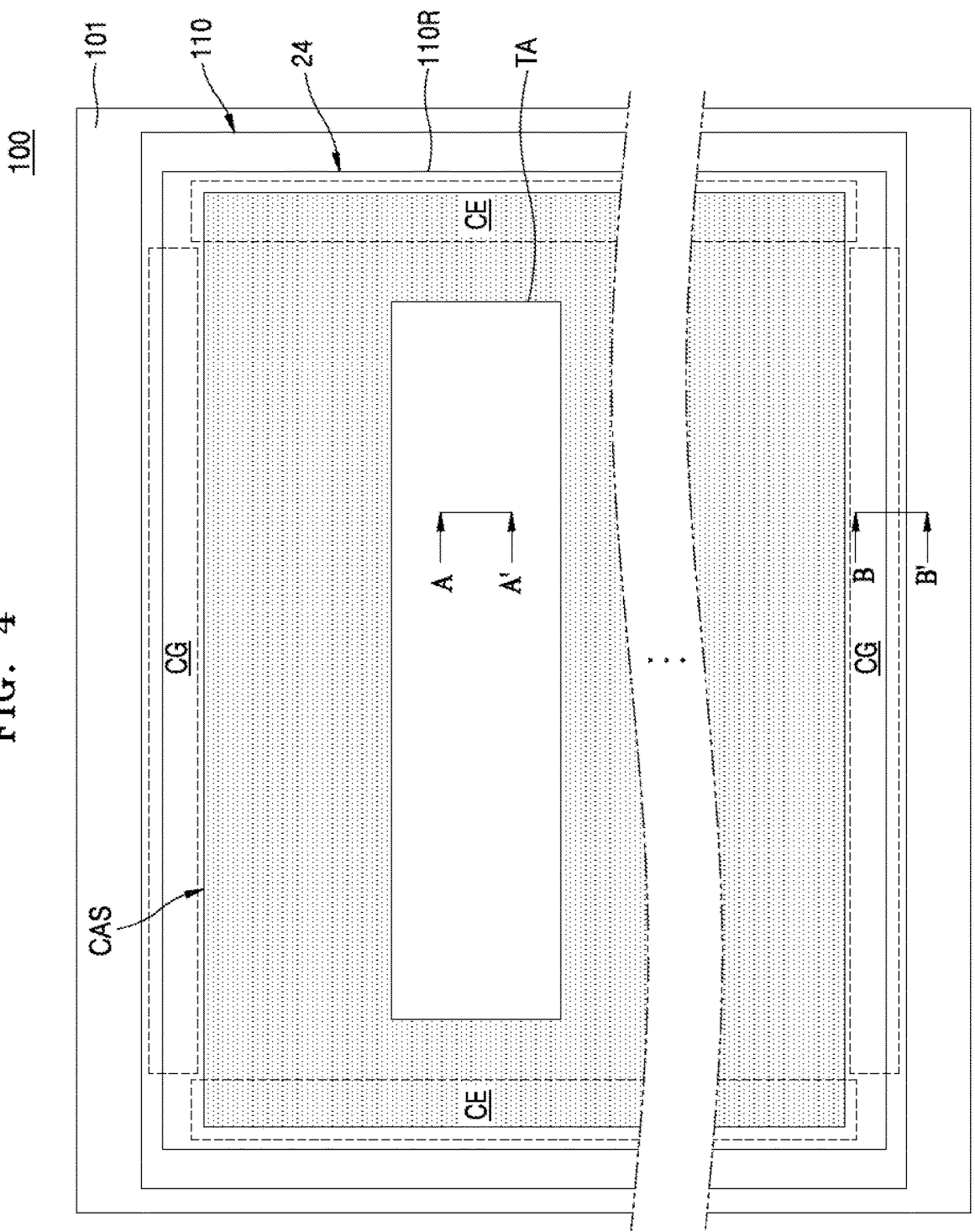
FIG. 4 is a plan view illustrating the planar arrangement of elements of an integrated circuit device according to an embodiment.
Figure 5:
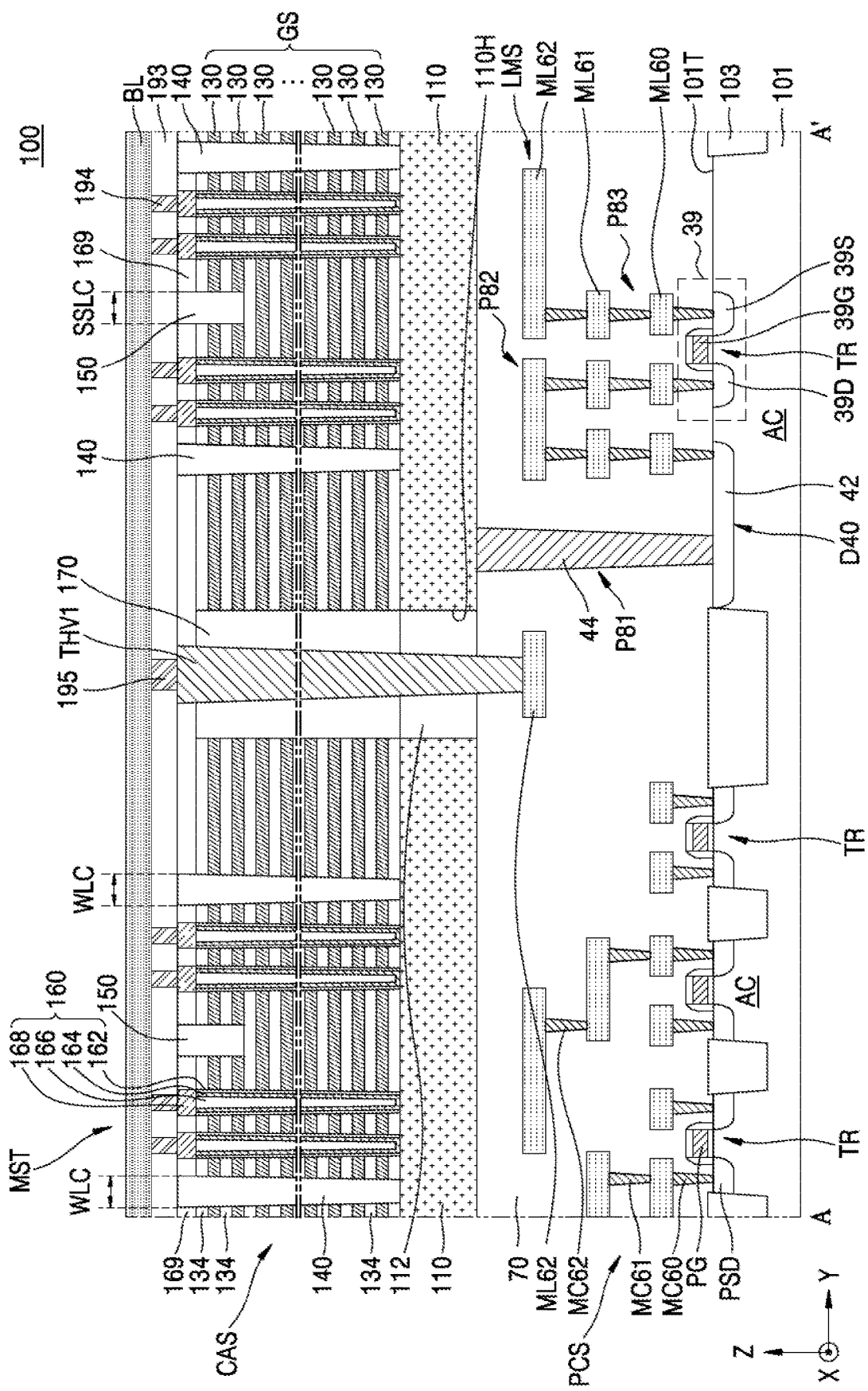
FIG. 5 is a side cross-sectional view illustrating a portion of an integrated circuit device taken along line A-A' of FIG. 4.

FIG. 4 is a plan view illustrating the planar arrangement of elements of an integrated circuit device 100 according to an embodiment of the inventive concept, and FIG. 5 is a side cross-sectional view illustrating a portion of an integrated circuit device taken along line A-A' of FIG. 4.

Figure 6:
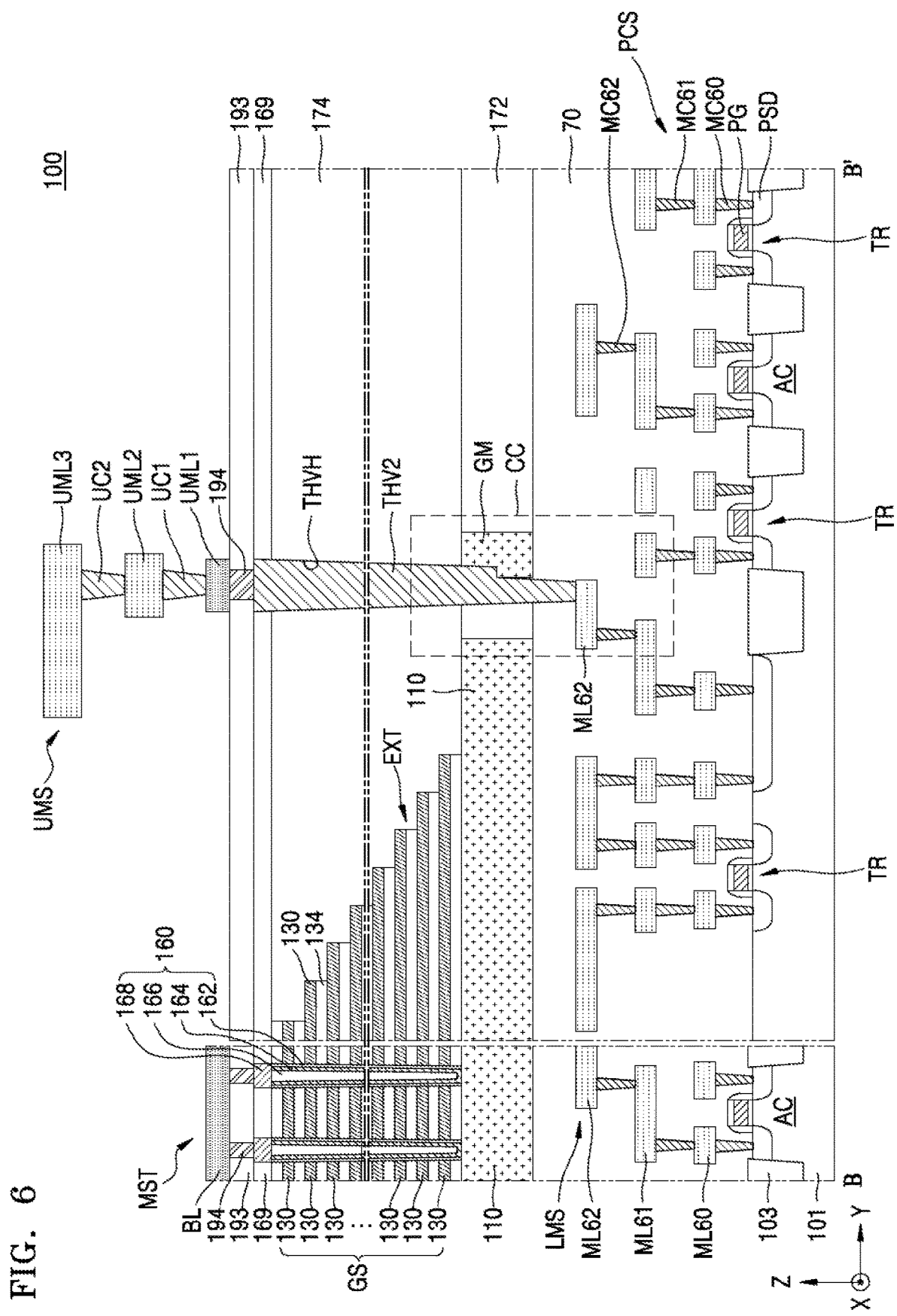
FIG. 6 is a side cross-sectional view illustrating a portion of an integrated circuit device taken along line B-B' of FIG. 4.

Referring to FIGS. 4 to 6, the integrated circuit device 100 may include a peripheral circuit structure PCS, a conductive plate 110 covering a portion of the peripheral circuit structure PCS, and a cell array structure CAS disposed on the peripheral circuit structure PCS with the conductive plate 110 therebetween.

In the integrated circuit device 100 according to an embodiment of the inventive concept, a substrate 101 and the conductive plate 110 may vertically overlap each other, and the conductive plate 110 may include a tile region 110R disposed at a position corresponding to one tile 24.

The conductive plate 110 may include a plurality of first edge conductive regions CE disposed at both sides in a first horizontal direction (an X direction) in the tile region 110R. Also, the conductive plate 110 may include a plurality of second edge conductive regions CG disposed at both sides of the tile region 110R in a second horizontal direction (a Y direction).

The conductive plate 110 may be disposed between the peripheral circuit structure PCS and the cell array structure CAS and may act as a common source line CSL (see FIG. 3). In some embodiments, the conductive plate 110 may act as a source region which supplies a current to a plurality of memory cells included in the cell array structure CAS. Here, the conductive plate 110 may be referred to as a plate common source line (CSL). Accordingly, throughout the disclosure, the CSL symbol may refer to either a common source line or a plate common source line, and will be evident by the context and embodiment being described. In some embodiments, the conductive plate 110 may include doped polysilicon, but the present disclosure is not necessarily limited thereto.

The conductive plate 110 may include a through hole via region TA. The through hole via region TA may extend further in the first horizontal direction (the X direction) than in the second vertical direction (the Y direction). In some embodiments, at least one word line cut region WLC and at least one memory stack MST may be included in the through hole via region TA.

A plurality of through holes 110H may be formed in the through hole via region TA. Also, the through hole via region TA may be disposed at various positions in the tile region 110R of the conductive plate 110. For example, the through hole via region TA may be approximately disposed at a center of the tile region 110R in the second horizontal direction (the Y direction), but the present disclosure is not necessarily limited thereto.

The cell array structure CAS may include a memory stack MST disposed on the conductive plate 110. The memory stack MST may include a gate stack GS. The gate stack GS may include a plurality of gate lines 130 which extend parallel in a horizontal direction and overlap one another in a vertical direction (a Z direction). Each of the plurality of gate lines 130 may include metal, metal silicide, an impurity-doped semiconductor, or a combination thereof.

Insulation layers 134 may be disposed between the conductive plate 110 and the plurality of gate lines 130 and between two adjacent gate lines 130 of the plurality of gate lines 130. A top surface of an uppermost gate line 130 of the plurality of gate lines 130 may be covered by the insulation layer 134. The insulation layer 134 may include silicon oxide.

The plurality of word line cut regions WLC may pass through the memory stack MST on the conductive plate 110. A width of each of the plurality of gate lines 130 in the second horizontal direction (the Y direction) may be limited by the plurality of word line cut regions WLC. The plurality of gate lines 130 may be arranged apart from one another repeatedly by an interval by using the plurality of word line cut regions WLC.

An insulation layer 140 may be filled into each of the plurality of word line cut regions WLC. The insulation layer 140 may include silicon oxide, silicon nitride, silicon oxynitride, or a low-k dielectric material.

A plurality of gate lines 130 configuring one gate stack GS may be stacked between (for example, two) adjacent word line cut regions WLC to overlap one another in the vertical direction (the Z direction), on the conductive plate 110. Two upper gate lines 130 of the plurality of gate lines 130 may be apart from each other in the second horizontal direction (the Y direction) with a string selection line cut region SSLC therebetween. An insulation layer 150 may be filled into the string selection line cut region SSLC. The insulation layer 150 may include silicon oxide, silicon nitride, silicon oxynitride, or a combination thereof. In some embodiments, an air gap may be filled into at least a portion of the string selection line cut region SSLC.

A plurality of channel structures 160 may pass through the plurality of gate lines 130 and may extend in the vertical direction (the Z direction). For example, the plurality of channel structures may contact the conductive plate 110. The plurality of channel structures 160 may be arranged apart from one another by an interval in the first horizontal direction (the X direction) and the second horizontal direction (the Y direction).

Each of the plurality of channel structures 160 may include a gate dielectric layer 162, a channel region 164, a buried insulation layer 166, and a drain region 168. The gate dielectric layer 162 may have a structure which includes a tunneling dielectric layer, a charge storage layer, and a blocking dielectric layer sequentially formed from the channel region 164. The channel region 164 may include polysilicon and may have a cylindrical shape. The buried insulation layer 166 may be filled into an internal space of the channel region 164. In some embodiments, the buried insulation layer 166 may be omitted, and in such embodiments, the channel region 164 may have a pillar structure including no internal space. The drain region 168 may include doped polysilicon and may be insulated from an adjacent drain region 168 by an upper insulation layer 169.

A plurality of bit lines BL may be disposed on the plurality of channel structures 160. The plurality of bit lines BL may be apart from the conductive plate 110 with the cell array structure CAS therebetween. The plurality of channel structures 160 may be covered by an insulation layer 193. Each of the plurality of channel structures 160 may be connected to one corresponding bit line BL through a contact pad 194 passing through the insulation layer 193.

In the drawing, one through hole of the plurality of through holes 110H formed in the through hole via region TA is illustrated. The buried insulation layer 112 may be filled into each of the plurality of through holes 110H formed in the through hole via region TA of the conductive plate 110. An insulation structure 170 may be disposed on the buried insulation layer 112. The insulation structure 170 may pass through the plurality of gate lines 130 and the plurality of insulation layers 134 and may extend in the vertical direction (the Z direction). Each of the buried insulation layer 112 and the insulation structure 170 may include silicon oxide, though the present disclosure is not necessarily limited thereto.

A through hole via may include a first through hole via THV1 formed in the through hole via region TA and a second through hole via THV2 disposed outside the conductive plate 110. The first through hole via THV1 may pass through the gate line 130 of the cell array structure CAS and may extend in the vertical direction (the Z direction), in the through hole via region TA.

The first through hole via THV1 may connect to one of the plurality of bit lines BL. The first through hole via THV1 may pass through the conductive plate 110 through one through hole 110H and may extend to an inner portion of the peripheral circuit structure PCS in the vertical direction (the Z direction). The first through hole via THV1 may be at least partially surrounded by the upper insulation layer 169 and the insulation structure 170, in the cell array structure CAS, and may be at least partially surrounded by the buried insulation layer 112, in the through hole 110H of the conductive plate 110. The first through hole via THV1 may include a top surface connected to one bit line BL, selected from among the plurality of bit lines BL, through the contact pad 195 and a bottom surface connected to a peripheral circuit included in the peripheral circuit structure PCS.

The peripheral circuit structure PCS may include a substrate 101, a peripheral circuit formed on a top surface 101T of the substrate 101, and a lower wiring structure LMS. The first through hole via THV1 may be connected to the peripheral circuit through the lower wiring structure LMS included in the peripheral circuit structure PCS.

The substrate 101 may include a semiconductor substrate. For example, the substrate 101 may include silicon (Si), germanium (Ge), or silicon germanium (SiGe). An active region AC may be defined by an isolation layer 103 in the substrate 101. A plurality of transistors TR configuring the peripheral circuit may be formed in the active region AC. Each of the plurality of transistors TR may include a gate PG and a plurality of ion implantation regions PSD, which are formed in the active region AC at both sides of the gate PG. Each of the plurality of ion implantation regions PSD may form a source/drain region of a corresponding transistor TR.

A common source line driver 39 may include at least one of the plurality of transistors TR included in the peripheral circuit structure PCS. The transistor TR of the common source line driver 39 may include a gate 39G disposed on the substrate 101, a source 39S formed on the substrate 101 adjacent to one side of the gate 39G, and a drain 39D formed on the substrate 101 adjacent to the other side of the gate 39G.

The lower wiring structure LMS may include a plurality of peripheral circuit contacts MC60, MC61, and MC62 and a plurality of peripheral circuit wiring layers ML60, ML61, and ML62 connected to a plurality of peripheral circuits included in the peripheral circuit structure PCS. At least some of the plurality of peripheral circuit wiring layers ML60, ML61, and ML62 may be configured to be electrically connected to a corresponding transistor TR. The plurality of peripheral circuit contacts MC60, MC61, and MC62 may connect some transistors, selected from among the plurality of transistors TR, to some peripheral circuit wiring layers selected from among the plurality of peripheral circuit wiring layers ML60, ML61, and ML62.

A bottom surface of the first through hole via THV1 may be connected to one wiring layer of the plurality of peripheral circuit wiring layers ML60, ML61, and ML62. For example, the bottom surface of the first through hole via THV1 may be connected to an uppermost peripheral circuit wiring layer ML62 closest to the cell array structure CAS among the plurality of peripheral circuit wiring layers ML60, ML61, and ML62.

In the drawing, the lower wiring structure LMS is illustrated as including a three-layer wiring layer in the vertical direction (the Z direction), but the present disclosure is not necessarily limited thereto. For example, the lower wiring structure LMS may include a three-layer wiring layer or a four or more-layer wiring layer.

In some embodiments, thicknesses of the plurality of peripheral circuit wiring layers ML60, ML61, and ML62 in the vertical direction (the Z direction) may differ. For example, the plurality of peripheral circuit wiring layers ML60, ML61, and ML62 may have different thicknesses determined by a distance from the substrate 101 in the vertical direction (the Z direction). In some embodiments, widths of the plurality of peripheral circuit contacts MC60, MC61, and MC62 in a horizontal direction (the X direction or the Y direction) may differ based on a distance from the substrate 101 in the vertical direction (the Z direction). For example, as a distance from the substrate 101 in the vertical direction (the Z direction) increases, a horizontal-direction width of each of the plurality of peripheral circuit contacts MC60, MC61, and MC62 may also increase.

The peripheral circuit structure PCS may further include an anti-arcing diode D40 formed in the substrate 101. The anti-arcing diode D40 may be connected to the conductive plate 110 by a first wiring structure P81.

The anti-arcing diode D40 may include an anti-arcing ion implantation region 42. In some embodiments, the active region AC of the substrate 101 may include a first conductive type ion implantation region, and the anti-arcing ion implantation region 42 may include a second conductive type ion implantation region. The first conductive type ion implantation region and the second conductive type ion implantation region may form a PN junction diode. The anti-arcing ion implantation region 42 may have the same conductive type as that of each of the source 39S and the drain 39D of the common source line driver 39.

The first wiring structure P81 may be configured with a bypass via contact 44 which includes a top surface that contacts the bottom surface of the conductive plate 110, and a bottom surface that contacts the anti-arcing ion implantation region 42. The drain 39D of the common source line driver 39 may be spaced apart from the anti-arcing diode D40 in the second horizontal direction (the Y direction) and may be connected to the anti-arcing ion implantation region 42 of the anti-arcing diode D40 through a second wiring structure P82. The source 39S of the common source line driver 39 may be connected to a ground power source through a third wiring structure P83. Each of the second and third wiring structures P82 and P83 may be a portion of the lower wiring structure LMS.

In some embodiments, when undesired electric charges accumulate into the conductive plate 110, an arcing current caused by the accumulated electrical charges may be bypassed to the substrate 101 through the first wiring structure P81 and the anti-arcing diode D40. Accordingly, the common source line driver 39 may be prevented from degradation by arcing, and have increased reliability.

The bypass via contact 44, the plurality of peripheral circuit wiring layers ML60, ML61, and ML62, and the plurality of peripheral circuit contacts MC60, MC61, and MC62 may each include metal, conductive metal nitride, metal silicide, or a combination thereof.

The plurality of transistors TR, the bypass via contact 44, and the lower wiring structure LMS each included in the peripheral circuit structure PCS may be covered by an interlayer insulation layer 70. The first through hole via THV1 may pass through a portion of the interlayer insulation layer 70 and may contact a top surface of an uppermost peripheral circuit wiring layer ML62. The interlayer insulation layer 70 may include silicon oxide, silicon nitride, silicon oxynitride, and/or the like.

In the integrated circuit device 100, an insulation layer covering the interlayer insulation layer 70 outside the conductive plate 110 may be provided. The insulation layer may include a first insulation layer 172 and a second insulation layer 174 which at least partially covers an extension portion EXT of each of the plurality of gate lines 130 on the first insulation layer 172. A top surface of the second insulation layer 174 may be covered by the upper insulation layer 169 and the insulation layer 193.

The second through hole via THV2 may include a bottom surface that contacts a top surface of the uppermost peripheral circuit wiring layer ML62, and a top surface connected to a plurality of upper wiring patterns UML1, UML2, and UML3 disposed at a vertical level which is higher than a vertical level of each of the plurality of channel structures 160 and may extend in the vertical direction (the Z direction).

The second through hole via THV2 may pass through the upper insulation layer 169, the second insulation layer 174, and the first insulation layer 172, may pass through a portion of the interlayer insulation layer 70, and may be connected to the top surface of the uppermost peripheral circuit wiring layer ML62. The second through hole via THV2 may be electrically connected to an upper wiring structure UMS through one contact pad of the plurality of contact pads 194.

The second through hole via THV2 may include at least one metal selected from among tungsten (W), gold (Au), silver (Ag), copper (Cu), aluminum (Al), titanium aluminum nitride (TiAlN), tungsten nitride (WN), iridium (Ir), platinum (Pt), palladium (Pd), ruthenium (Ru), zirconium (Zr), rhodium (Rh), nickel (Ni), cobalt (Co), chromium (Cr), tin (Sn), and zinc (Zn). In some embodiments, the second through hole via THV2 may include a metal layer including tungsten and a conductive barrier layer surrounding the metal layer. The conductive barrier layer may include titanium (Ti), titanium nitride (TiN), tantalum (Ta), tantalum nitride (TaN), or a combination thereof.

The integrated circuit device 100 according to an embodiment of the inventive concept may include an etch guide member GM which is disposed in the first insulation layer 172 at the same level as the conductive plate 110 and contacts a portion of the second through hole via THV2. The etch guide member GM will be described below in detail.

The upper wiring structure UMS may include a first upper wiring pattern UML1, a second upper wiring pattern UML2, and a third upper wiring pattern UML3, which are disposed at different vertical levels. The upper wiring structure UMS may further include a first upper contact UC1 connected between the first upper wiring pattern UML1 and the second upper wiring pattern UML2 and a second upper contact UC2 connected between the second upper wiring pattern UML2 and the third upper wiring pattern UML3. In some embodiments, the first upper wiring pattern UML1 may be disposed at the same vertical level as a bit line BL.

The upper wiring structure UMS may include metal, conductive metal nitride, metal silicide, or a combination thereof. For example, the upper wiring structure UMS may include a metal pattern including W, Al, or Cu and a conductive barrier layer surrounding the metal pattern. The upper wiring structure UMS may be covered by an insulation layer.

Figure 7:
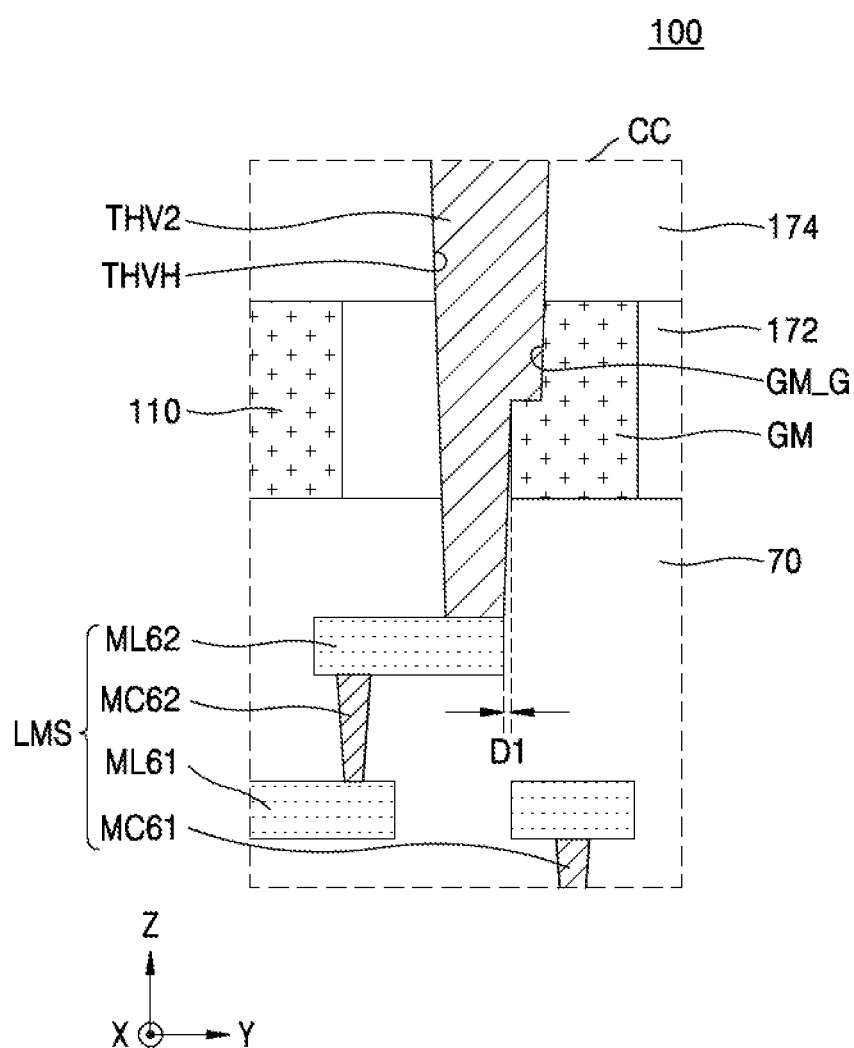
FIG. 7 is a side cross-sectional view illustrating the enlargement of an integrated circuit device according to an embodiment corresponding to a region CC of FIG. 6.
Figure 8:
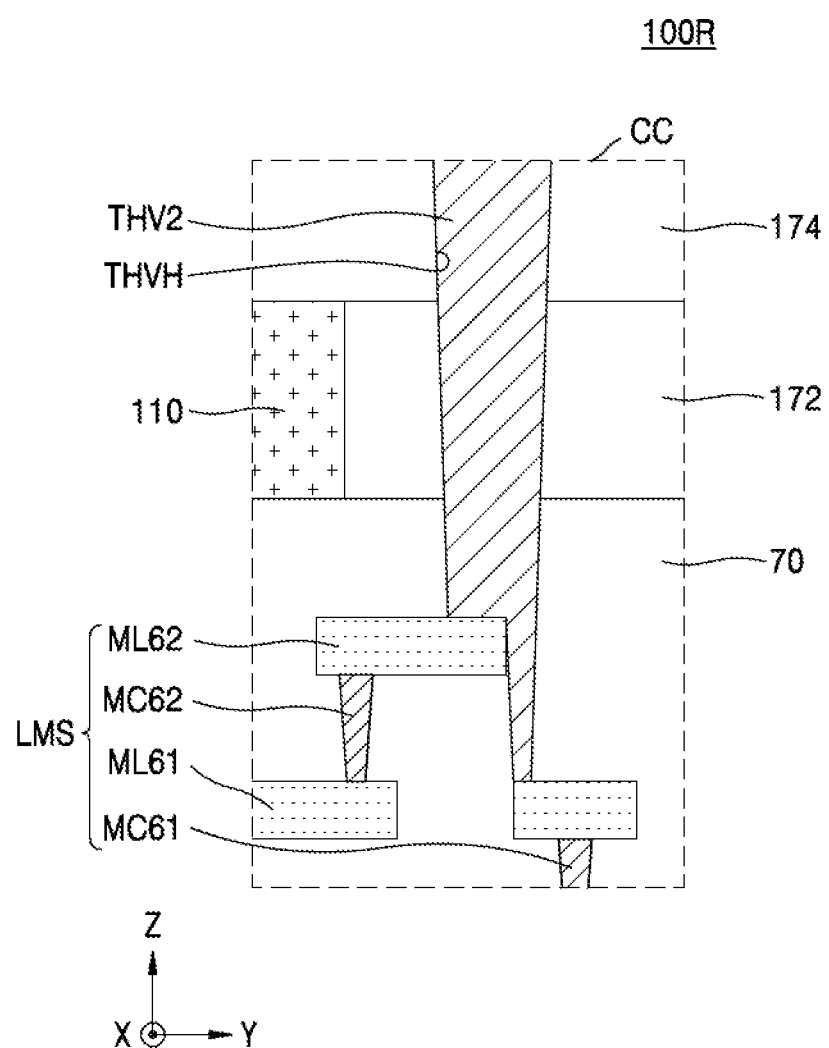
FIG. 8 is a side cross-sectional view illustrating the enlargement of an integrated circuit device according to a comparative example corresponding to the region CC of FIG. 6.

FIG. 7 is a side cross-sectional view illustrating the enlargement of an integrated circuit device 100 according to an embodiment corresponding to a region CC of FIG. 6, and FIG. 8 is a side cross-sectional view illustrating the enlargement of an integrated circuit device according to a comparative example corresponding to the region CC of FIG. 6.

Elements included in an integrated circuit device 100 described below and materials of the elements may be as described above with reference to FIGS. 4 to 6. Therefore, like reference numerals described above refer to like elements.

Referring to FIGS. 7 and 8, a difference between an integrated circuit device according to an embodiment and an integrated circuit device according to a comparative example is illustrated.

The integrated circuit device 100 according to an embodiment of the inventive concept may include an etch guide member GM which is disposed in a first insulation layer 172 at the same level as a conductive plate 110 and contacts a portion of a second through hole via THV2.

A groove GM_G may be formed on an edge of the etch guide member GM that contacts the second through hole via THV2, and a sidewall of the second through hole via THV2 contacting the etch guide member GM may be formed in a staircase shape which is filled into the groove GM_G. For example, the etch guide member GM may be formed to penetrate into the second through hole via THV2 in a second horizontal direction (a Y direction).

In some embodiments, a width of a top surface of the second through hole via THV2 in a horizontal direction (an X direction or a Y direction) may be larger than a width of a bottom surface thereof in the horizontal direction. That is, the second through hole via THV2 may have a tapered shape where a width of the second through hole via THV2 narrows as it extends toward a top surface 101T of the substrate 101, and the width of the second through hole via THV2 may discontinuously narrow at a point contacting the etch guide member GM. For example, the width of the second through hole via THV2 may decrease by a step interval at a point contacting the etch guide member GM.

A memory stack MST (see FIG. 6) may be disposed on the conductive plate 110, and the memory stack MST (see FIG. 6) may be not disposed on the etch guide member GM. That is, the etch guide member GM may be disposed apart from an outer edge of the conductive plate 110.

The etch guide member GM may include a material different from that of each of first and second insulation layers 172 and 174, and the etch guide member GM and the conductive plate 110 may include the same material. For example, the first and second insulation layers 172 and 174 may include silicon oxide, silicon nitride, silicon oxynitride, or a low-k dielectric material. The etch guide member GM may include doped polysilicon. Also, a material included in the etch guide member GM may have an etch selectivity (for example, a different etch rate) with respect to a material included in each of the first and second insulation layers 172 and 174.

Based on a process of manufacturing the integrated circuit device 100, a groove GM_G of the etch guide member GM contacting the second through hole via THV2 may correspond to a portion of the etch guide member GM damaged by dry etching. The etch guide member GM may include substantially the same material as that of the conductive plate 110 and may have substantially the same thickness at substantially the same level as the conductive plate 110.

In some embodiments, the etch guide member GM may be disposed at only one sidewall of the second through hole via THV2. In this case, the etch guide member GM may be disposed apart from the conductive plate 110 with the second through hole via THV2 therebetween. Also, an uppermost peripheral circuit wiring layer ML62 and the etch guide member GM may be spaced apart from each other by a certain distance D1 in the second horizontal direction (the Y direction) so as not to overlap each other in a vertical direction (a Z direction).

Unlike the integrated circuit device 100 according to an embodiment of the inventive concept, an integrated circuit device 100R of a comparative example may not include the etch guide member GM contacting a portion of the second through hole via THV2. The integrated circuit device 100R of the comparative example may be an part of a general integrated circuit device.

The second through hole via THV2 may be formed by etching a through hole via hole THVH in the first and second insulation layers 172 and 174, and filling the through hole via hole THVH with a conductive material. In some cases, to increase integration, as the number of steps of a memory stack MST (see FIG. 6) increases, a length of the second through hole via THV2 in the vertical direction (the Z direction) may also increase.

For example, an etch depth for forming the through hole via hole THVH may also increase, and this may cause distortion or an error in a dry etching process performed on the first and second insulation layers 172 and 174 where stiffness thereof is relatively low. Due to the distortion or error of the dry etching process, a bottom surface of the second through hole via THV2 may contact a peripheral circuit wiring layer ML61 instead of the uppermost peripheral circuit wiring layer ML62. In such cases, contact reliability between an upper wiring layer and a lower wiring layer may be reduced.

To correct the distortion or error of the dry etching process, for example, etch equipment may be changed to high-performance equipment for controlling an etching process involving a high aspect ratio, but improvements for changing the arrangement and size of a peripheral circuit wiring layer may be needed. In some cases, the former may be too costly, and the latter may be inappropriate for a design.

To address the above, the integrated circuit device 100 according to an embodiment of the inventive concept may include an etch guide member GM disposed in the first insulation layer 172 at the same level as the conductive plate 110 to induce etching in a desired direction.

By using the etch guide member GM having an etch selectivity with respect to the material included in each of the first and second insulation layers 172 and 174, the integrated circuit device 100 according to an embodiment of the inventive concept may prevent a case where a bottom surface of the second through hole via THV2 contacts the peripheral circuit wiring layer ML61 instead of the uppermost peripheral circuit wiring layer ML62, such as from an error in an etching process.

In the integrated circuit device 100 according to an embodiment of the inventive concept, the etch guide member GM may be formed of a portion of the conductive plate 110 and disposed at a position which has to be removed, and thus, an additional manufacturing process may not be needed.

Accordingly, in the integrated circuit device 100 according to an embodiment of the inventive concept, the etch guide member GM may be provided at one side of the second through hole via THV2 and disposed outside the conductive plate 110, and thus, contact reliability between an upper wiring layer and a lower wiring layer may be increased, thereby providing increased electrical characteristics.

Figure 9:
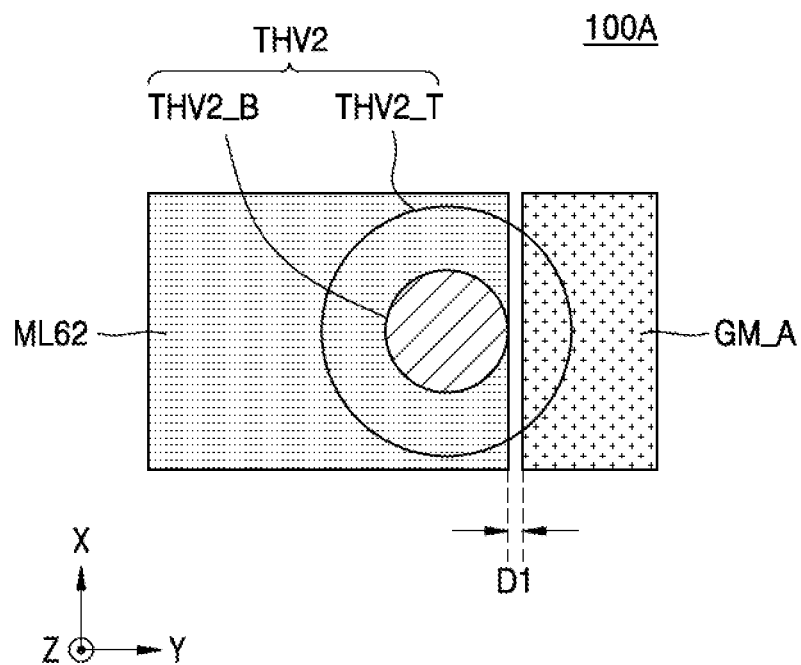
FIGS. 9 to 11 are plan views illustrating some elements of an integrated circuit device according to another embodiment.
Figure 10:
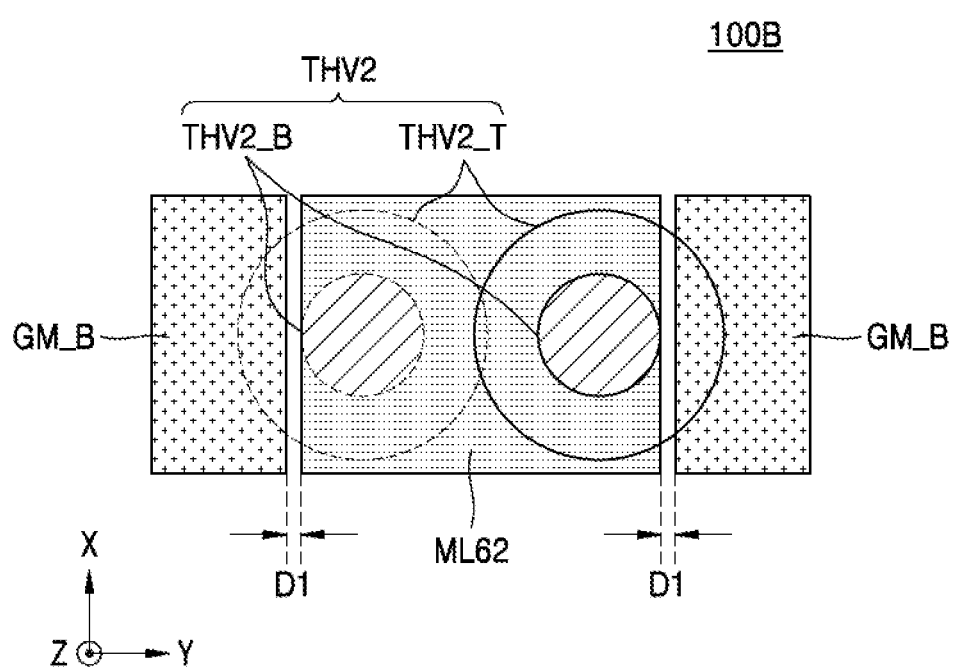
Figure 11:
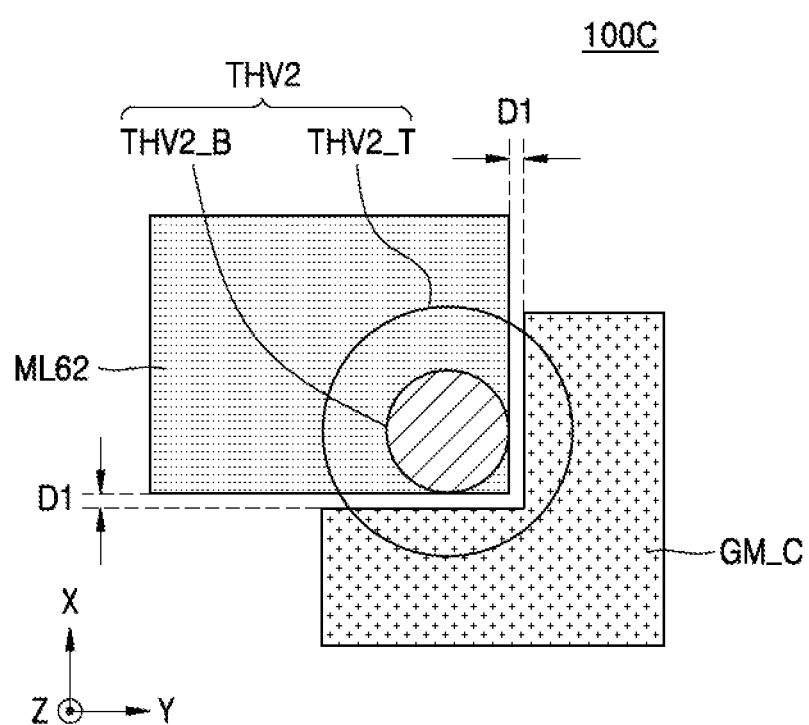

FIGS. 9 to 11 are plan views illustrating some elements of an integrated circuit device according to another embodiment of the inventive concept.

Referring to FIG. 9, in an integrated circuit device 100A according to the present embodiment of the inventive concept, an etch guide member GM_A may be formed at one side of an upper portion of an uppermost peripheral circuit wiring layer ML62.

A top surface THV2_T and a bottom surface THV2_B each included in a second through hole via THV2 may have different sizes, based on a dry etching process performed on the second through hole via THV2. In some cases, there may be a tendency for etch distortion or an etch error occurring in a process of forming the second through hole via THV2. Therefore, based on the tendency, the etch guide member GM_A may be disposed at a position for offsetting the etch distortion or the etch error.

The etch guide member GM_A and a conductive plate 110 (see FIG. 6) may be disposed apart from each other with the second through hole via THV2 therebetween. Also, the uppermost peripheral circuit wiring layer ML62 and the etch guide member GM_A may be disposed apart from each other by a certain distance D1 in a second horizontal direction (a Y direction) so as not to overlap each other in a vertical direction (a Z direction).

Therefore, in the integrated circuit device 100A according to the present embodiment, the etch guide member GM_A may be provided at one side of the second through hole via THV2 disposed outside the conductive plate 110, and thus, contact reliability between an upper wiring layer and a lower wiring layer may be increased, thereby providing increased electrical characteristics.

Referring to FIG. 10, in an integrated circuit device 100B according to the present embodiment, an etch guide member GM_B may be formed at one side of an upper portion of an uppermost peripheral circuit wiring layer ML62.

A top surface THV2_T and a bottom surface THV2_B each included in a second through hole via THV2 may have different sizes, based on a dry etching process performed on the second through hole via THV2. In some cases, etch distortion or an etch error occurring in a process of forming the second through hole via THV2 may irregularly occur. Therefore, the etch guide member GM_B may be disposed at a position for offsetting the etch distortion or the etch error.

For example, the etch guide member GM_B may be disposed at both sides of the uppermost peripheral circuit wiring layer ML62 with the uppermost peripheral circuit wiring layer ML62 therebetween. Also, the uppermost peripheral circuit wiring layer ML62 and the etch guide member GM_B may be disposed apart from each other by a certain distance D1 in a second horizontal direction (a Y direction) so as not to overlap each other in a vertical direction (a Z direction).

Therefore, in the integrated circuit device 100B according to the present embodiment, the etch guide member GM_B may be provided at both sides of the second through hole via THV2 disposed outside the conductive plate 110, and thus, contact reliability between an upper wiring layer and a lower wiring layer may be increased, thereby providing increased electrical characteristics.

Referring to FIG. 11, in an integrated circuit device 100C according to the present embodiment, an etch guide member GM_C may be formed in a bent shape to correspond to one corner of an upper portion of an uppermost peripheral circuit wiring layer ML62.

A top surface THV2_T and a bottom surface THV2_B each included in a second through hole via THV2 may have different sizes, based on a dry etching process performed on the second through hole via THV2. In some cases, there may be a tendency for etch distortion or an etch error occurring in a process of forming the second through hole via THV2. Therefore, the etch guide member GM_C may be disposed at a position for offsetting the etch distortion or the etch error.

The etch guide member GM_C may be formed in a bent shape which allows the etch guide member GM_C to vertically contact the uppermost peripheral circuit wiring layer ML62 at one corner of the uppermost peripheral circuit wiring layer ML62. Also, the uppermost peripheral circuit wiring layer ML62 and the etch guide member GM_C may be disposed apart from each other by a certain distance D1 in a first horizontal direction (an X direction) and a second horizontal direction (a Y direction) so as not to overlap each other in a vertical direction (a Z direction).

Therefore, in the integrated circuit device 100C according to the present embodiment, the etch guide member GM_C may be provided at a corner of the second through hole via THV2 disposed outside the conductive plate 110, and thus, contact reliability between an upper wiring layer and a lower wiring layer may be increased, thereby providing increased electrical characteristics.

Figure 12:
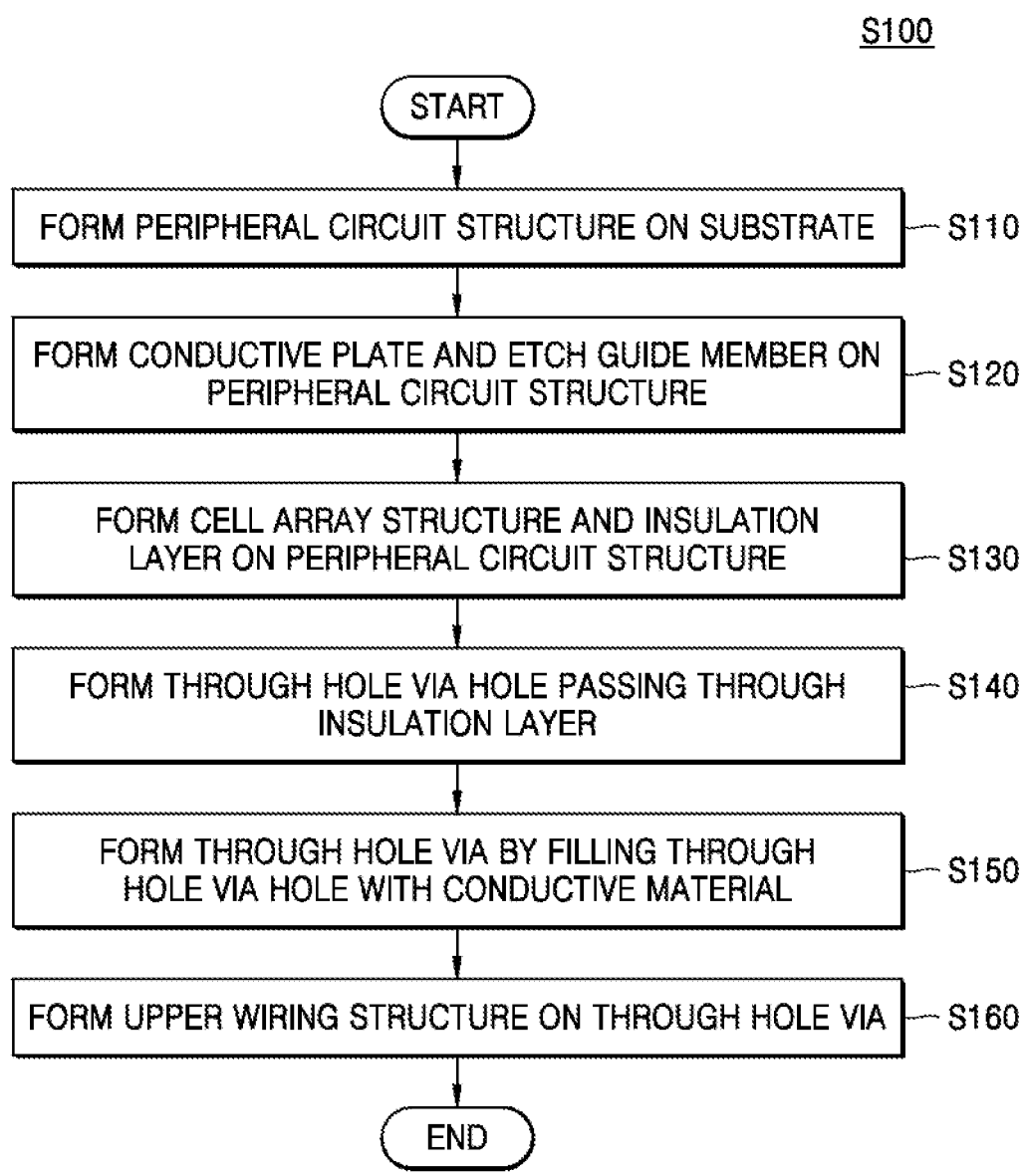
FIG. 12 is a flowchart illustrating a method of manufacturing an integrated circuit device, according to an embodiment.

FIG. 12 is a flowchart illustrating a method of manufacturing an integrated circuit device, according to an embodiment of the inventive concept.

Referring to FIG. 12, a method S100 of manufacturing an integrated circuit device may include a process sequence of first to sixth operations S110 to S160.

In a case where an arbitrary embodiment of the present inventive concept is differently implemented, a certain process sequence may be performed differently from a described sequence. For example, two processes successively described may be performed substantially simultaneously, or may be performed in a sequence opposite to a described sequence.

The method S100 of manufacturing an integrated circuit device may include the first operation S110 of forming a peripheral circuit structure on a substrate, the second operation S120 of forming a conductive plate and an etch guide plate on the peripheral circuit structure, the third operation S130 of forming a cell array structure and an insulation layer on the peripheral circuit structure, the fourth operation S140 of forming a through hole via hole passing through the insulation layer, the fifth operation S150 of forming a through hole via by filling the through hole via hole with a conductive material, and the sixth operation S160 of forming an upper wiring structure on the through hole via.

Technical features of each of the first to sixth operations S110 to S160 will be described in detail with reference to FIGS. 13 to 17.

FIGS. 13 to 17 are side cross-sectional views illustrating a method of manufacturing an integrated circuit device in a process sequence, according to an embodiment of the inventive concept.

Figure 13:
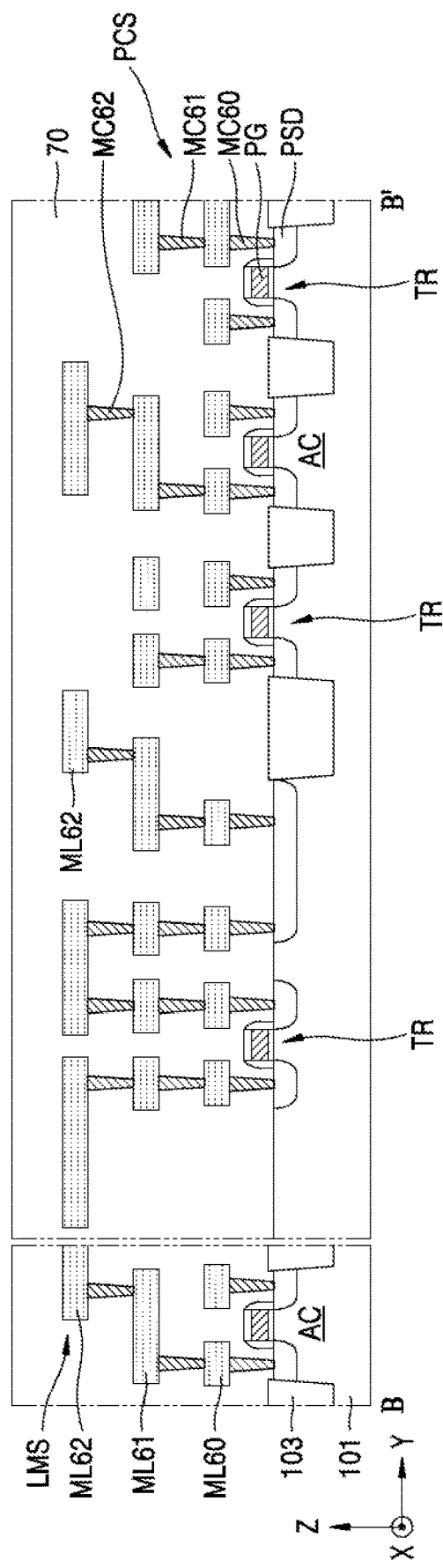
FIGS. 13 to 17 are side cross-sectional views illustrating a method of manufacturing an integrated circuit device in a process sequence, according to an embodiment.

Referring to FIG. 13, a peripheral circuit structure PCS may include a substrate 101, a plurality of transistors TR, a lower wiring structure LMS, and an interlayer insulation layer 70.

The substrate 101 may include a semiconductor substrate. For example, the substrate 101 may include Si, Ge, or SiGe. An active region AC may be defined by an isolation layer 103, in the substrate 101. The plurality of transistors TR configuring a peripheral circuit may be formed in the active region AC. Each of the plurality of transistors TR may include a gate PG and a plurality of ion implantation regions PSD, which are formed in the active region AC. Each of the plurality of ion implantation regions PSD may form a source/drain region of a corresponding transistor TR.

Figure 14:
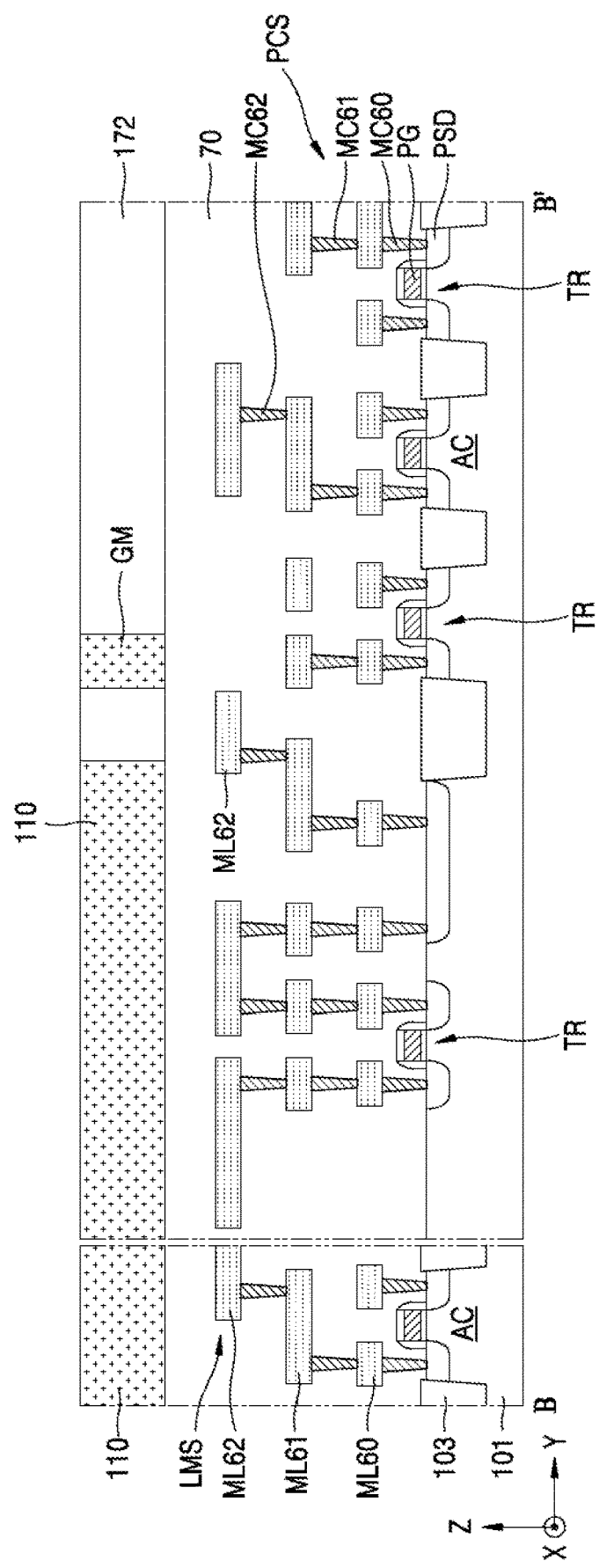

Referring to FIG. 14, a conductive plate 110 and an etch guide member GM may be formed on the peripheral circuit structure PCS.

Conductive polysilicon may be formed on the peripheral circuit structure PCS, and by etching the conductive polysilicon, the conductive plate 110 and the etch guide member GM may be formed. The conductive plate 110 and the etch guide member GM may be formed apart from each other.

A first insulation layer 172 may surround the conductive plate 110 and the etch guide member GM. The first insulation layer 172 may include silicon oxide, silicon nitride, silicon oxynitride, or a low-k dielectric material.

Figure 15:
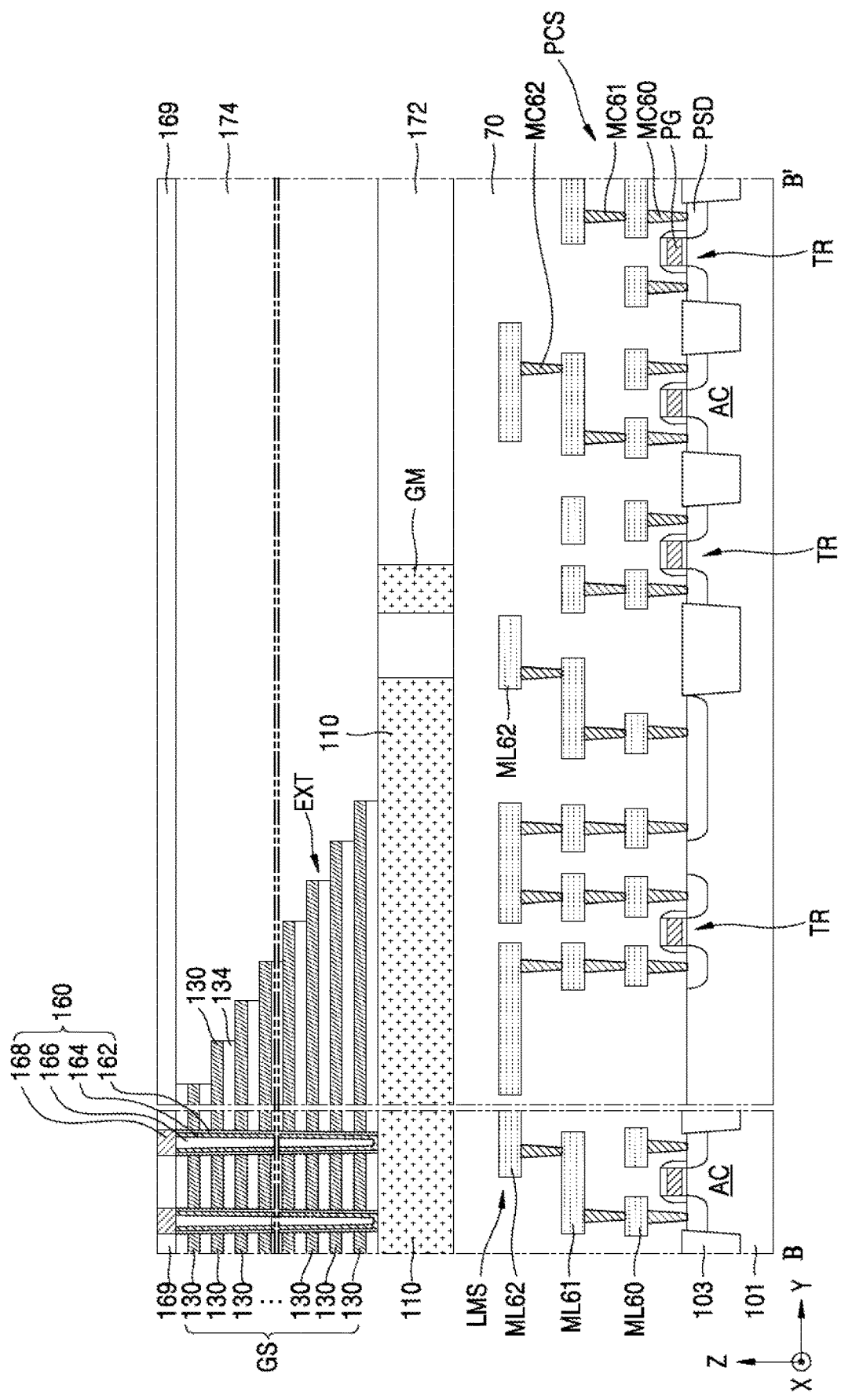

Referring to FIG. 15, a cell array structure CAS including a memory stack may be formed on the conductive plate 110.

The cell array structure CAS may include the memory stack disposed on the conductive plate 110. The memory stack may include a gate stack GS. The gate stack GS may include a plurality of gate lines 130 which extend parallel in a horizontal direction and overlap one another in a vertical direction (a Z direction). Each of the plurality of gate lines 130 may include metal, metal silicide, an impurity-doped semiconductor, or a combination thereof.

A second insulation layer 174 may be formed on the first insulation layer 172 to cover an extension portion EXT of each of the plurality of gate lines 130, at a periphery of the conductive plate 110. A top surface of the second insulation layer 174 may be covered by an upper insulation layer 169.

Figure 16:
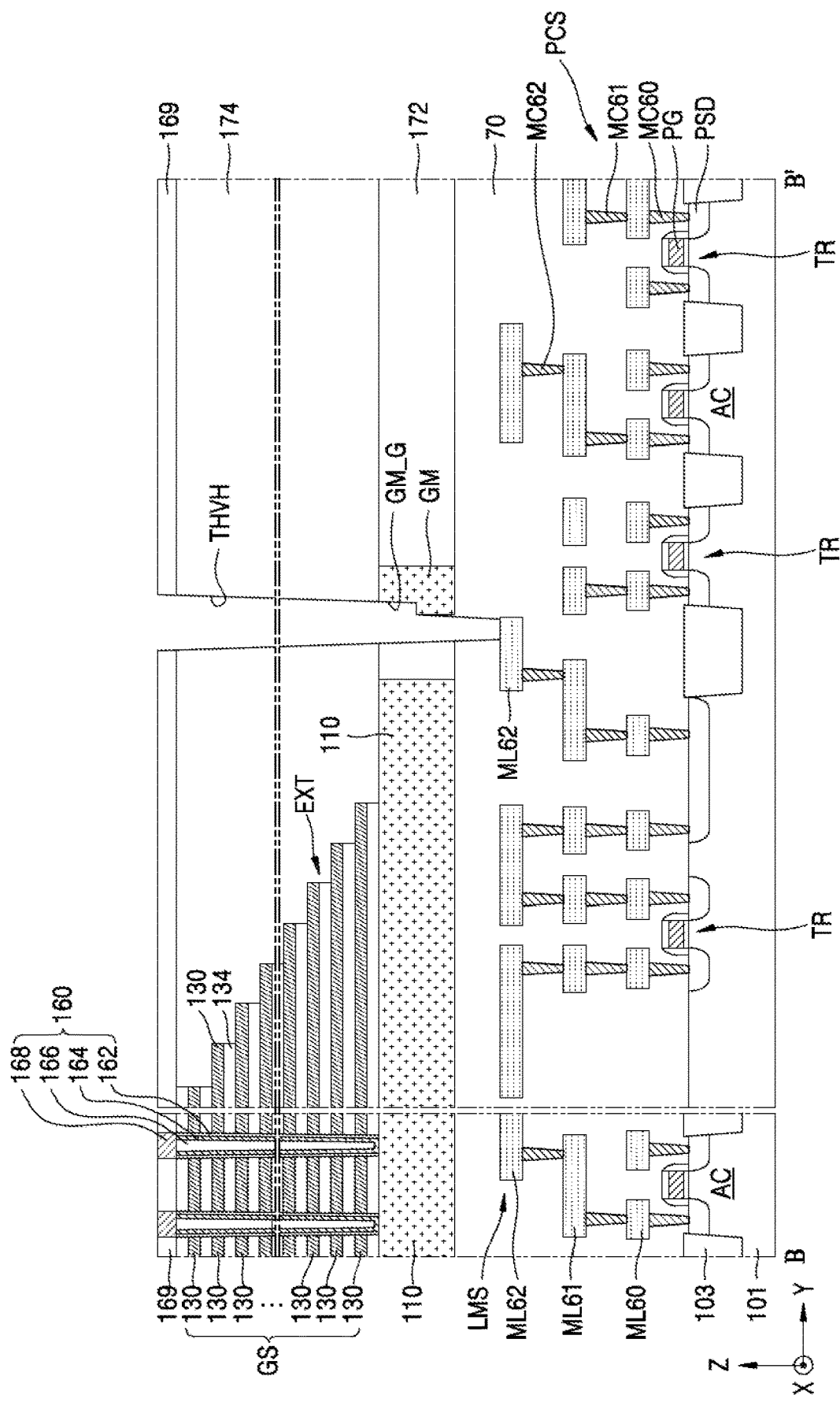

Referring to FIG. 16, a through hole via hole THVH passing through the upper insulation layer 169, the second insulation layer 174, and the first insulation layer 172 may be formed by a dry etching process.

As the number of steps of the memory stack increases, an etch depth for forming the through hole via hole THVH may also increase, and this may cause distortion or error in a dry etching process performed on the first and second insulation layers 172 and 174. The etch guide member GM may prevent a bottom surface of the through hole via hole THVH from being formed up to a peripheral circuit wiring layer ML61 due to distortion or error of the dry etching process, and direct the formation of the through hole via hole THVH to an uppermost peripheral circuit wiring layer ML62.

The etch guide member GM with an etch selectivity with respect to a material included in each of the first and second insulation layers 172 and 174 may be used. In an example etching process, the etch selectivity of the etch guide member GM may cause the etch guide member GM to be etched at a different rate, resulting in a damaged or deformed portion of the etch guide member. Therefore, a groove GM_G of the etch guide member GM may be formed in a region with the through hole via hole THVH formed therein and may correspond to a portion of the etch guide member GM damaged by dry etching.

Figure 17:
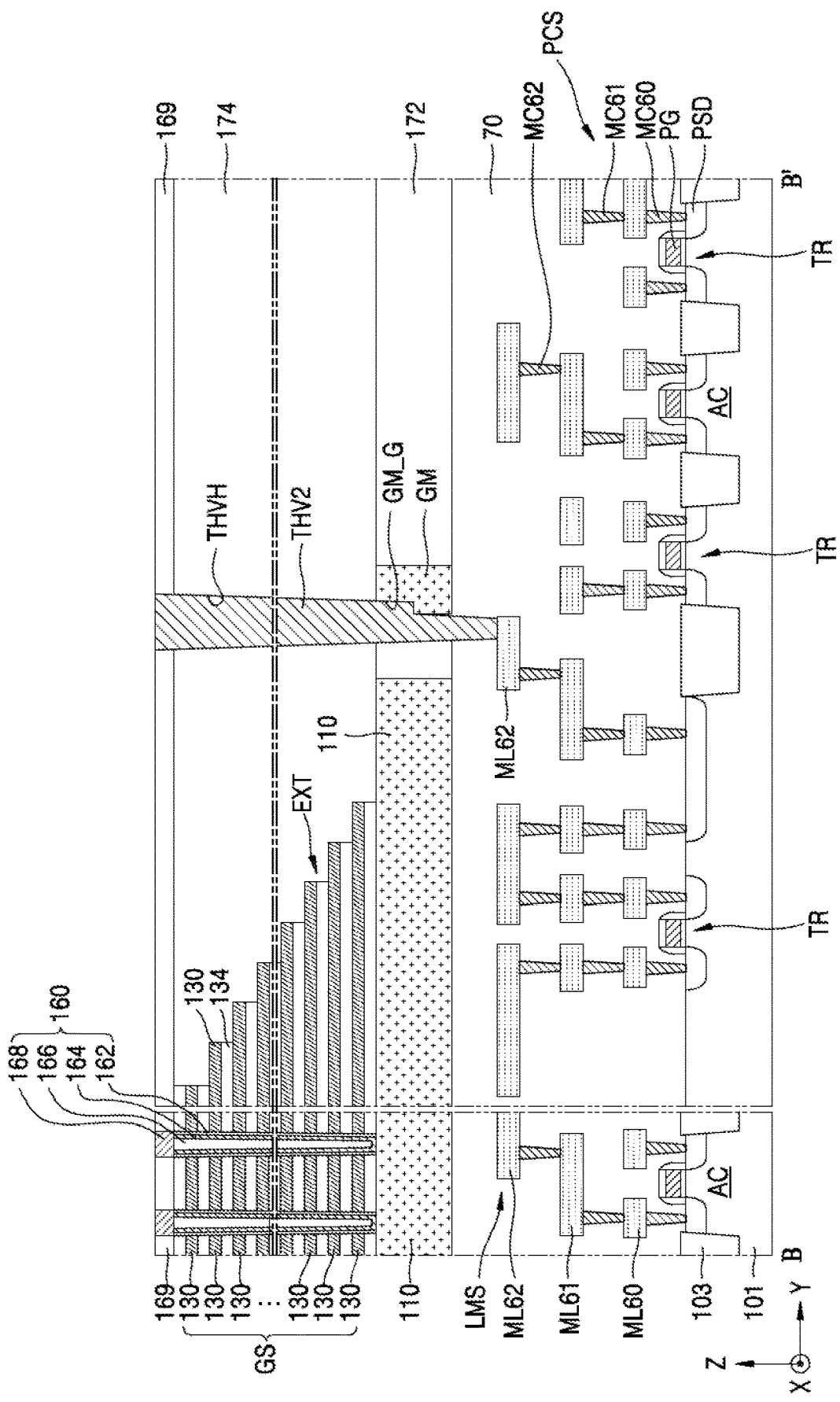

Referring to FIG. 17, a second through hole via THV2 disposed outside the conductive plate 110 may be formed by filling the through hole via hole THVH with a conductive material.

The second through hole via THV2 may pass through the upper insulation layer 169, the second insulation layer 174, and the first insulation layer 172, may pass through a portion of the interlayer insulation layer 70, and may be connected to a top surface of the uppermost peripheral circuit wiring layer ML62.

A sidewall of the second through hole via THV2 contacting the etch guide member GM may be formed in a staircase shape filled into the groove GM_G. For example, the etch guide member GM may penetrate into the second through hole via THV2 in a second horizontal direction (a Y direction).

Referring again to FIG. 6, a plurality of upper wiring patterns UML1, UML2, and UML3 may be formed on the second through hole via THV2. A top surface of the second through hole via THV2 may be electrically connected to the plurality of upper wiring patterns UML1, UML2, and UML3 disposed at a vertical level which is higher than a vertical level of each of the plurality of channel structures 160.

Based on such a manufacturing process, in the integrated circuit device 100 according to an embodiment of the inventive concept, the etch guide member GM may be provided at one side of the second through hole via THV2 and disposed outside the conductive plate 110, and thus, contact reliability between an upper wiring layer and a lower wiring layer may be increased, thereby providing increased electrical characteristics.

Figure 18:
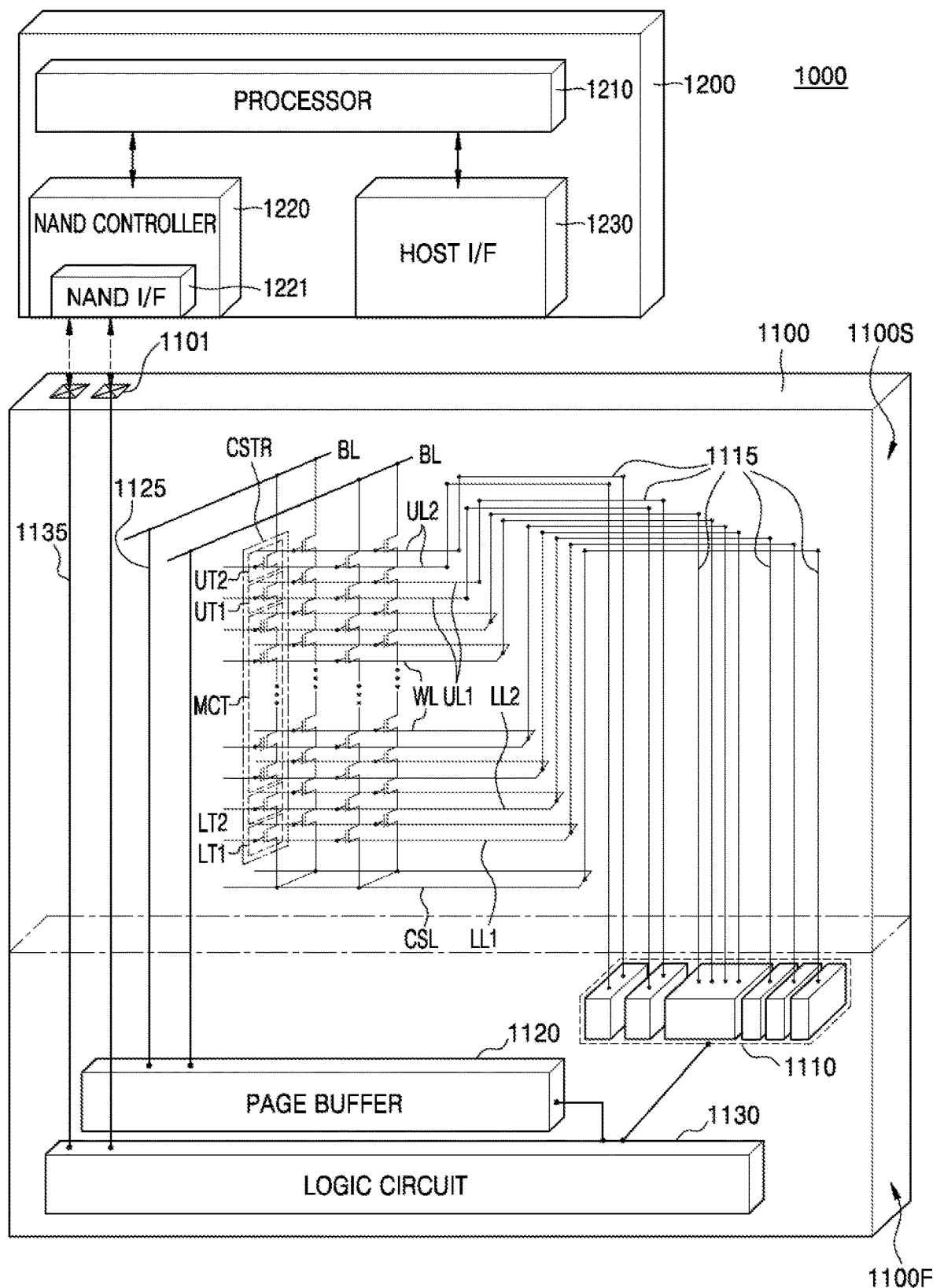
FIG. 18 is a diagram illustrating an electronic system including an integrated circuit device, according to embodiments.

FIG. 18 is a diagram illustrating an electronic system 1000 including an integrated circuit device, according to an embodiment of the inventive concept.

Referring to FIG. 18, the electronic system 1000 according to an embodiment of the inventive concept may include an integrated circuit device 1100 and a controller 1200 electrically connected to the integrated circuit device 1100.

The electronic system 1000 may include a storage device, including one or a plurality of integrated circuit devices 1100, or an electronic device including a storage device. For example, the electronic system 1000 may include a solid state drive (SSD) device, a universal serial bus (USB), a computing system, a medical device, or a communication device, which includes at least one integrated circuit device 1100.

The integrated circuit device 1100 may include a non-volatile vertical memory device. For example, the integrated circuit device 1100 may include a NAND flash memory device including at least one of the integrated circuit devices 100, 100A, 100B, and 100C described above with reference to FIGS. 4 to 11. The integrated circuit device 1100 may include a first structure 1100F and a second structure 1100S on the first structure 1100F. In some embodiments, the first structure 1100F may be disposed at one side of the second structure 1100S. The first structure 1100F may include a peripheral circuit structure which includes a decoder circuit 1110, a page buffer 1120, and a logic circuit 1130. The second structure 1100S may include a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include a plurality of lower transistors LT1 and LT2 adjacent to the common source line CSL, a plurality of upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary across embodiments.

In some embodiments, the upper transistors UT1 and UT2 may include a string selection transistor, and the lower transistors LT1 and LT2 may include a ground selection transistor. The first and second gate lower lines LL1 and LL2 may respectively be gate electrodes of the lower transistors LT1 and LT2. The word line WL may be a gate electrode of the memory cell transistor MCT, and the gate upper lines UL1 and UL2 may respectively be gate electrodes of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connection wirings 1115 which extend up to the second structure 1100S from an inner portion of the first structure 1100F. The plurality of bit lines BL may be electrically connected to the page buffer 1120 through a plurality of second connection wirings 1125 which extend up to the second structure 1100S from the inner portion of the first structure 1100F.

In the first structure 1100F, the decoder circuit 1110 and the page buffer 1120 may execute a control operation on at least one memory cell transistor of the plurality of memory cell transistors MCT. The decoder circuit 1110 and the page buffer 1120 may be controlled by the logic circuit 1130.

The integrated circuit device 1100 may communicate with the controller 1200 through an input/output (I/O) pad 1101 electrically connected to the logic circuit 1130. The I/O pad 1101 may be electrically connected to the logic circuit 1130 through an I/O connection wiring 1135 which extends up to the second structure 1100S from the inner portion of the first structure 1100F.

The controller 1200 may include a processor 1210, a NAND controller 1220, and a host interface 1230. In some embodiments, the electronic system 1000 may include a plurality of integrated circuit devices 1100, and in this case, the controller 1200 may control the plurality of integrated circuit devices 1100.

The processor 1210 may control an overall operation of the electronic system 1000 including the controller 1200. The processor 1210 may operate based on firmware and may control the NAND controller 1220 to access the integrated circuit device 1100. The NAND controller 1220 may include a NAND interface 1221, which processes communication with the integrated circuit device 1100. A control command for controlling the integrated circuit device 1100, data to be written in the plurality of memory cell transistors MCT of the integrated circuit device 1100, and data to be read from the plurality of memory cell transistors MCT of the integrated circuit device 1100 may be transferred through the NAND interface 1221. The host interface 1230 may provide a communication function between the electronic system 1000 and an external host. When a control command is received from the external host through the host interface 1230, the processor 1210 may control the integrated circuit device 1100 in response to the control command.

Figure 19:
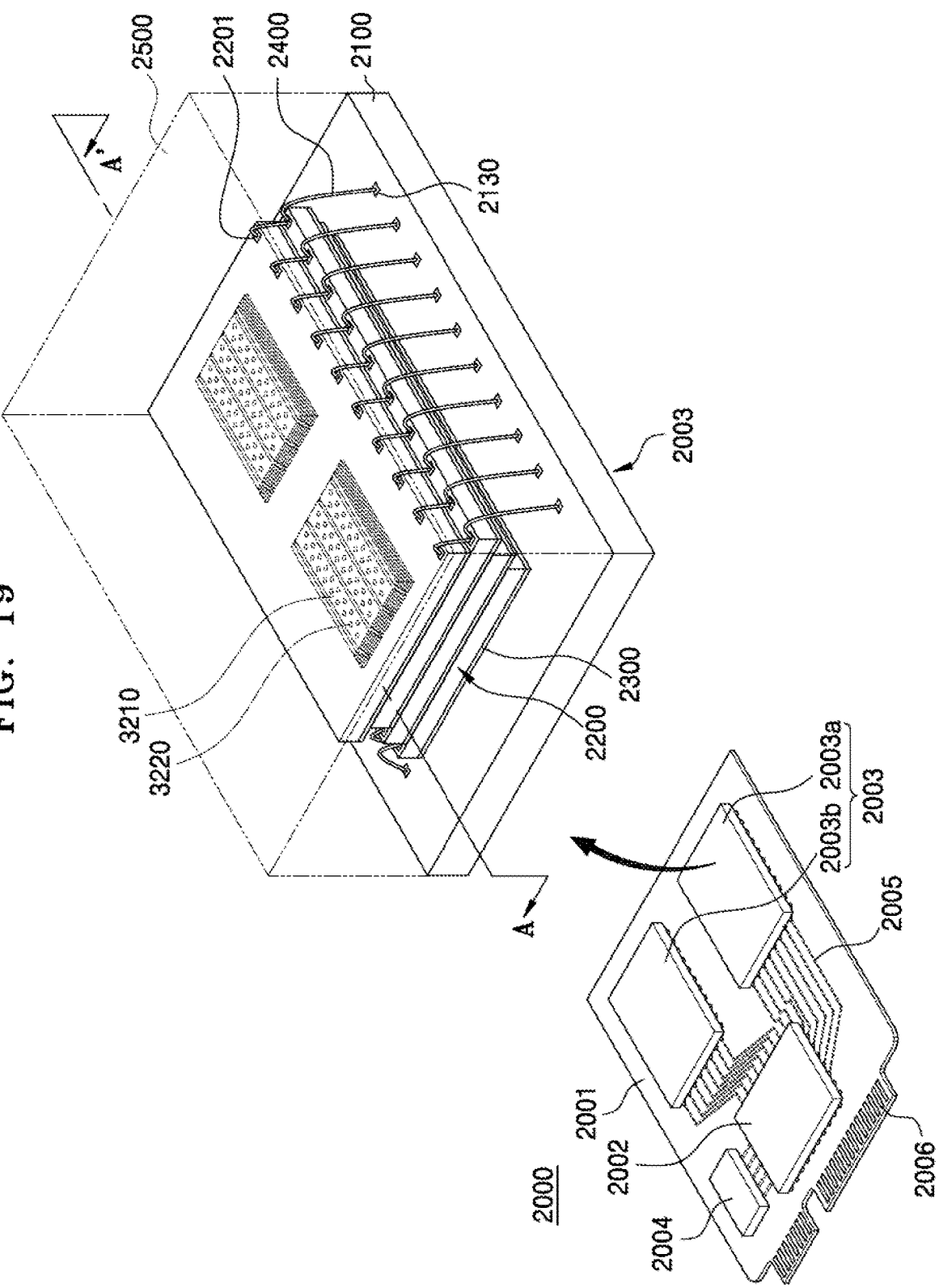
FIG. 19 is a perspective view illustrating an electronic system including an integrated circuit device, according to embodiments.

FIG. 19 is a perspective view illustrating an electronic system 2000 including an integrated circuit device, according to embodiments of the inventive concept.

Referring to FIG. 19, the electronic system 2000 according to an embodiment of the inventive concept may include a main board 2001, a controller 2002 mounted on the main board 2001, one or more semiconductor packages 2003, and DRAM 2004. The semiconductor package 2003 and the DRAM 2004 may be connected to the controller 2002 by a plurality of wiring patterns 2005 provided on the main board 2001.

The main board 2001 may include a connector 2006 including a plurality of pins coupled to the external host. The number and arrangement of pins in the connector 2006 may be changed based on a communication interface between the electronic system 2000 and the external host. In some embodiments, the electronic system 2000 may communicate with the external host on the basis of one of interfaces such as USB, peripheral component interconnect express (PCI-Express), serial advanced technology attachment (SATA), and/or M-Phy for universal flash storage (UFS). In some embodiments, the electronic system 2000 may operate based on power supplied from the external host through the connector 2006. The electronic system 2000 may further include a power management integrated circuit (PMIC) that distributes the power supplied from the external host to the controller 2002 and the semiconductor package 2003.

The controller 2002 may write data in the semiconductor package 2003 or may read data from the semiconductor package 2003, and may increase an operation speed of the electronic system 2000.

The DRAM 2004 may include a buffer memory for reducing a speed difference between the external host and the semiconductor package 2003, which is a data storage space. The DRAM 2004 included in the electronic system 2000 may operate as a cache memory and may provide a space for arbitrarily storing data in a control operation performed on the semiconductor package 2003. When the DRAM 2004 is included in the electronic system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which may be spaced apart from each other. Each of the first and second semiconductor packages 2003a and 2003b may include a semiconductor package that includes a plurality of semiconductor chips 2200. Each of the first and second semiconductor packages 2003a and 2003b may include a package substrate 2100, the plurality of semiconductor chips 2200 on the package substrate 2100, an adhesive layer 2300 disposed on a bottom surface of each of the plurality of semiconductor chips 2200, a connection structure 2400 electrically connecting the plurality of semiconductor chips 2200 to the package substrate 2100, and a molding layer 2500 which covers the plurality of semiconductor chips 2200 and the connection structure 2400 on the package substrate 2100.

The package substrate 2100 may include a printed circuit board (PCB) including a plurality of package upper pads 2130. Each of the plurality of semiconductor chips 2200 may include an I/O pad 2201. The I/O pad 2201 may correspond the I/O pad 1101 of FIG. 18. Each of the plurality of semiconductor chips 2200 may include a plurality of gate stacks 3210 and a plurality of channel structures 3220. Each of the plurality of semiconductor chips 2200 may include at least one the integrated circuit devices 100, 100A, 100B, and 100C described above with reference to FIGS. 4 to 11.

In some embodiments, the connection structure 2400 may include a bonding wire which electrically connects the I/O pad 2201 to the package upper pad 2130. Therefore, in the first and second semiconductor packages 2003a and 2003b, the plurality of semiconductor chips 2200 may be electrically connected to one another through bonding wires and may be electrically connected to the package upper pad 2130 of the package substrate 2100. In some embodiments, in the first and second semiconductor packages 2003a and 2003b, the plurality of semiconductor chips 2200 may be electrically connected to one another by a connection structure including a through silicon via (TSV) instead of the connection structure 2400 based on bonding wires.

In some embodiments, the controller 2002 and the plurality of semiconductor chips 2200 may be included in one package. In some embodiments, the controller 2002 and the plurality of semiconductor chips 2200 may be mounted on a separate interposer substrate which differs from the main board 2001, and the controller 2002 and the plurality of semiconductor chips 2200 may be electrically connected to one another by a wiring formed on the interposer substrate.

Figure 20:
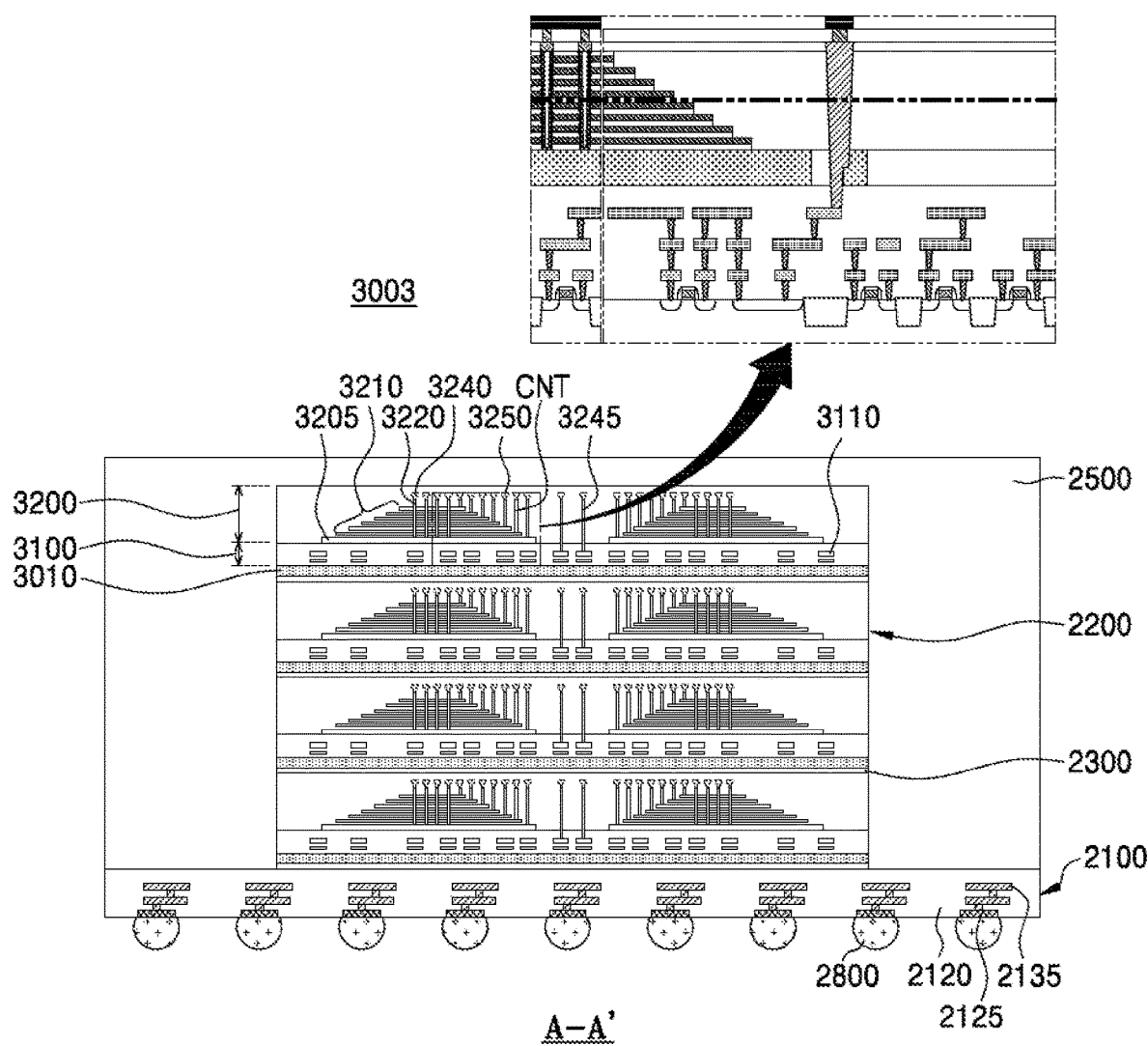
FIG. 20 is a cross-sectional view illustrating a semiconductor package including an integrated circuit device, according to embodiments.

FIG. 20 is a cross-sectional view illustrating a semiconductor package 3003 including an integrated circuit device, according to embodiments of the inventive concept.

In detail, in FIG. 20, a configuration of a semiconductor package based on a cross-sectional surface taken along line A-A' of FIG. 19 is illustrated.

Referring to FIG. 20, in the semiconductor package 3003, a package substrate 2100 may include a PCB.

The package substrate 2100 may include a package substrate body part 2120, a plurality of package upper pads 2130 (see FIG. 19) disposed on a top surface of the package substrate body part 2120, a plurality of lower pads 2125 which are disposed on or exposed through a bottom surface of the package substrate body part 2120, and a plurality of internal wirings 2135 which electrically connect a plurality of upper pads 2130 to the plurality of lower pads 2125 in the package substrate body part 2120. The plurality of upper pads 2130 may be electrically connected to a plurality of connection structures 2400 (see FIG. 19). The plurality of lower pads 2125 may be connected to the plurality of wiring patterns 2005 on the main board 2001 of the electronic system 2000 illustrated in FIG. 19 through a plurality of conductive connection parts 2800.

Each of the plurality of semiconductor chips 2200 may include a semiconductor substrate 3010, and a first structure 3100 and a second structure 3200, which are stacked on the semiconductor substrate 3010. The first structure 3100 may include a peripheral circuit region including a plurality of peripheral wirings 3110. The first structure 3100, as described above with reference to FIG. 6, may include a transistor TR. In FIG. 20, it is illustrated that the first structure 3100 has a structure similar to a peripheral circuit region of the integrated circuit device 100 illustrated in FIG. 6, but the inventive concept is not necessarily limited thereto.

The second structure 3200 may include a common source line 3205, a gate stack 3201 on the common source line 3205, a channel structure 3220 passing through the gate stack 3210, and a bit line 3240 electrically connected to the channel structure 3220. The gate stack 3210 may include a gate stack GS illustrated in FIG. 6. The gate stack GS may include a plurality of gate lines 130. Each of the plurality of semiconductor chips 2200 may include a plurality of contact structures CNT electrically connected to a gate line 130.

Each of the plurality of semiconductor chips 2200 may include a through wiring 3245 electrically connected to a plurality of peripheral wirings 3110 of the first structure 3100 and that extends to an inner portion of the second structure 3200. The through wiring 3245 may be disposed outside the gate stack 3210. In other embodiments, the semiconductor package 3003 may further include a through wiring which passes through the gate stack 3210. Each of the plurality of semiconductor chips 2200 may further include an I/O pad 2201 (see FIG. 19) electrically connected to the plurality of peripheral wirings 3110 of the first structure 3100.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a substrate;
a peripheral circuit structure disposed on the substrate, wherein the peripheral circuit structure includes a peripheral circuit and a lower wiring connected to the peripheral circuit;
a conductive plate covering a portion of the peripheral circuit structure;
a cell array structure disposed on the peripheral circuit structure with the conductive plate therebetween, wherein the cell array structure includes a memory cell array and an insulation layer surrounding the memory cell array;
a through hole via passing through the insulation layer, wherein the through hole via connects to the lower wiring and extends in a direction vertical to a top surface of the substrate; and
an etch guide member disposed outside of the conductive plate in the insulation layer at the same level as the conductive plate, wherein:
wherein the conductive plate is configured to transfer a common source voltage to the memory cell array,
the through hole via is disposed between the etch guide member and the conductive plate and contacts the etch guide member on a first side of the through hole via, and
wherein the through hole via contacts the insulation layer on a second side of the through hole via opposite to the first side.

2. The integrated circuit device of claim 1, wherein a groove is formed on an edge of the etch guide member, and
wherein a sidewall of the through hole via contacting the etch guide member is formed in a staircase shape filled into the groove.

3. The integrated circuit device of claim 2, wherein the etch guide member is disposed at one side of the through hole via.

4. The integrated circuit device of claim 1, wherein the memory cell array is disposed on the conductive plate, and
wherein the memory cell array is not disposed on the etch guide member.

5. The integrated circuit device of claim 1, wherein the lower wiring comprises a plurality of wiring layers, and
wherein a lowermost surface of the through hole via contacts a top surface of an uppermost layer of the plurality of wiring layers.

6. The integrated circuit device of claim 5, further comprising an upper wiring disposed at a level that is higher than a level of the memory cell array,
wherein an uppermost surface of the through hole via is connected to the upper wiring, and
wherein a width of the uppermost surface of the through hole via is greater than a width of the lowermost surface of the through hole via.

7. The integrated circuit device of claim 1, wherein the etch guide member and the insulation layer comprise different materials, and
wherein the etch guide member and the conductive plate comprise the same material.

8. The integrated circuit device of claim 7, wherein a material of the etch guide member has an etch selectivity with respect to a material of the insulation layer.

9. The integrated circuit device of claim 7, wherein the etch guide member and the conductive plate comprise doped polysilicon, and
wherein a maximum thickness of the etch guide member is the same as a maximum thickness of the conductive plate.

10. An integrated circuit device comprising:
a substrate;
a peripheral circuit structure disposed on the substrate, wherein the peripheral circuit structure includes a peripheral circuit and a lower wiring connected to the peripheral circuit;
a cell array structure overlapping the peripheral circuit structure in a vertical direction, wherein the cell array structure includes a memory stack that includes a plurality of gate lines stacked in the vertical direction and a channel structure passing through the plurality of gate lines in the vertical direction;
a conductive plate disposed between the peripheral circuit structure and the cell array structure;
a through hole via passing through the cell array structure wherein the through hole via extends to an inner portion of the peripheral circuit structure to be connected to the lower wiring, outside the conductive plate; and an etch guide member disposed outside the conductive plate at the same level as the conductive plate, wherein:
wherein the conductive plate is configured to transfer a common source voltage to the memory stack,
the etch guide member has the same thickness as a thickness of the conductive plate, and includes the same material as the conductive plate, with the through hole via therebetween;
wherein the etch guide member penetrates into the through hole via in a horizontal direction; and
wherein the through hole via is disposed between the etch guide member and the conductive plate and contacts the etch guide member on a first side of the through hole via and wherein the through hole via contacts the insulation layer on a second side of the through hole via opposite to the first side.

11. The integrated circuit device of claim 10, wherein the through hole via is electrically connected to an upper wiring disposed at a vertical level that is higher than a vertical level of the channel structure.

12. The integrated circuit device of claim 10, wherein a portion of the etch guide member comprises a portion damaged by dry etching in a direction contacting the through hole via.

13. The integrated circuit device of claim 10, wherein the through hole via has a tapered shape where a width of the through hole via narrows toward the substrate, and
wherein the width of the through hole via narrows discontinuously at a point contacting the etch guide member.

14. An integrated circuit device comprising:
a substrate;
a peripheral circuit structure disposed on the substrate, wherein the peripheral circuit structure includes a peripheral circuit and a plurality of lower wiring layers connected to the peripheral circuit;
a cell array structure overlapping the peripheral circuit structure in a vertical direction, wherein the cell array structure includes a memory stack that includes a plurality of gate lines stacked and a channel structure passing through the plurality of gate lines in the vertical direction, wherein the cell array structure further includes an insulation layer surrounding the memory stack, and a plurality of upper wiring layers disposed on the channel structure;
a plate common source line disposed between the peripheral circuit structure and the cell array structure;
a through hole via passing through the insulation layer, wherein the through hole via extends to an inner portion of the peripheral circuit structure to be connected up to an uppermost layer of the plurality of lower wiring layers from a lowermost layer of the plurality of upper wiring layers; and
an etch guide member disposed outside the plate common source line, wherein:
the etch guide member is disposed at the same level as the plate common source line, has the same thickness as a thickness of the plate common source line, and includes the same material as a material of the plate common source line, and
wherein the through hole via is disposed between the etch guide member and the conductive plate and contacts the etch guide member on a first side of the through hole via and wherein the through hole via contacts the insulation layer on a second side of the through hole via opposite to the first side.

15. The integrated circuit device of claim 14, wherein the etch guide member comprises doped polysilicon, and
wherein a material of the etch guide member has an etch selectivity with respect to a material of the insulation layer.

16. The integrated circuit device of claim 14, wherein the etch guide member is spaced apart from an uppermost layer of the plurality of lower wiring layers contacting the through hole via in a horizontal direction so as not to overlap each other.

17. The integrated circuit device of claim 14, wherein the etch guide member is spaced apart from an uppermost layer of the plurality of lower wiring layers in a vertical direction and is also spaced apart from the plate common source line in a horizontal direction.

18. The integrated circuit device of claim 14 wherein a groove is formed on an edge of the etch guide member,
wherein a sidewall of the through hole via contacting the etch guide member is filled into the groove, and
wherein a width of the through hole via narrows discontinuously at a point contacting the etch guide member.

* * * * *